United States Patent
Hosokawa et al.

(10) Patent No.: US 7,783,266 B2
(45) Date of Patent: Aug. 24, 2010

(54) BIDIRECTIONAL FREQUENCY CONVERTER AND RADIO EQUIPMENT USING SAME

(75) Inventors: Yoshifumi Hosokawa, Kanagawa (JP); Michiaki Matsuo, Tokyo (JP); Noriaki Saito, Tokyo (JP)

(73) Assignee: Panasonic Corporation, Osaka (JP)

( * ) Notice: Subject to any disclaimer, the term of this patent is extended or adjusted under 35 U.S.C. 154(b) by 728 days.

(21) Appl. No.: 11/576,932

(22) PCT Filed: Oct. 6, 2005

(86) PCT No.: PCT/JP2005/018523
§ 371 (c)(1), (2), (4) Date: Apr. 9, 2007

(87) PCT Pub. No.: WO2006/040997
PCT Pub. Date: Apr. 20, 2006

(65) Prior Publication Data
US 2009/0011720 A1    Jan. 8, 2009

(30) Foreign Application Priority Data
Oct. 8, 2004 (JP) ............................ 2004-295948
Sep. 22, 2005 (JP) ............................ 2005-275733

(51) Int. Cl.
H04B 1/40 (2006.01)
H04B 1/26 (2006.01)
H04B 15/00 (2006.01)

(52) U.S. Cl. .................... 455/84; 455/313; 455/318

(58) Field of Classification Search ............. 455/84, 455/313–334
See application file for complete search history.

(56) References Cited

U.S. PATENT DOCUMENTS 3,867,699 A * 2/1975 Stoffer .................. 455/78
2007/0243847 A1 * 10/2007 Shen ..................... 455/318

FOREIGN PATENT DOCUMENTS

| JP | 55-166309 | 12/1980 |
| JP | 57-065904 | 4/1982 |
| JP | 58-138107 | 8/1983 |

(Continued)

OTHER PUBLICATIONS

International Search Report for application No. PCT/JP2005/018523 dated Jan. 31, 2006.

*Primary Examiner*—Lana N Le
*Assistant Examiner*—Hsin-Chun Liao
(74) *Attorney, Agent, or Firm*—RatnerPrestia

(57) ABSTRACT

When a power supply switch is turned on and an RF signal and an LO signal are input to a bipolar transistor, a mixed signal of both signals is output as an IF signal. When the power supply switch is turned off, the bipolar transistor operates as two diodes connected between a base terminal and an emitter terminal and between the base terminal and a collector terminal. When the IF signal and the LO signal are input, the input signals are mixed with each other by the diodes and the RF signal is output. Accordingly, one frequency conversion has a plus conversion gain and when bidirectional frequency conversion is performed by the use of one frequency converter, an external circuit such as a signal path switching switch is not necessary.

15 Claims, 17 Drawing Sheets

FOREIGN PATENT DOCUMENTS

| | | |
|---|---|---|
| JP | 61-224506 | 10/1986 |
| JP | 63-300610 | 12/1988 |
| JP | 05-136709 | 6/1993 |
| JP | 05-268281 | 10/1993 |
| JP | 06-125368 | 5/1994 |
| JP | 06-350478 | 12/1994 |
| JP | 07-235836 | 9/1995 |
| JP | 07-273557 | 10/1995 |
| JP | 08-059843 | 3/1996 |
| JP | 09-214253 | 8/1997 |
| JP | 09-247108 | 9/1997 |
| JP | 09-252324 | 9/1997 |
| JP | 10-322241 | 12/1998 |
| JP | 2000-032757 | 1/2000 |
| JP | 2001-358605 | 12/2001 |
| JP | 2003-018038 | 1/2003 |
| JP | 2004-254009 | 9/2004 |

* cited by examiner

US 7,783,266 B2

BIDIRECTIONAL FREQUENCY CONVERTER AND RADIO EQUIPMENT USING SAME

This Application is a U.S. National Phase Application of PCT International Application PCT/JP2005/018523.

TECHNICAL FIELD

The present invention relates to a bidirectional frequency converter for converting a signal frequency used in a radio circuit of a wireless communication apparatus for mobile communication and a radio apparatus using the same.

BACKGROUND ART

In conventional wireless communication apparatuses having transmission and reception functions, a transmission system and a reception system are generally provided independent of each other in a radio unit. On the other hand, it has been attempted to accomplish simplification, decrease in size, and reduction in cost of the radio unit by sharing all or a part of the transmission system and the reception system.

Here, in order to use a frequency converter for performing frequency conversion of signals in the wireless communication apparatuses in common to the transmission system and the reception system, it is necessary to perform the frequency conversion between an intermediate frequency signal (hereinafter, referred to as IF signal) and a radio frequency signal (hereinafter, referred to as RF signal) in two ways.

An example of a conventional bidirectional frequency converter is disclosed in a document, entitled "Fundamental and Development of Microwave Semiconductor Circuit," written by Honjyo Kazuhiko, supervised by Konishi Yoshihiro, and made by THE NIKKANKOGYO SHIMBUN, LTD. p. 196-197. FIG. 20 is a circuit diagram illustrating an example of the bidirectional frequency converter disclosed in the document entitled "Fundamental and Development of Microwave Semiconductor Circuit."

In FIG. 20, when the bidirectional frequency converter converts an RF signal into an IF signal in frequency, the RF signal input to terminal 601 is input to diode bridge 606 through transformer 602 and a local oscillation signal (hereinafter, referred to as LO signal) is input from terminal 603 to diode bridge 606 through transformer 604. Then, the bidirectional frequency converter mixes the signals by the use of non-linearity of a diode to generate an IF signal and outputs the generated IF signal through terminal 605. When the bidirectional frequency converter converts the IF signal into the RF signal in frequency, the IF signal is input to terminal 605 and is mixed with the LO signal input from terminal 603 by diode bridge 606 to generate a RF signal. Then, the bidirectional frequency converter outputs the generated RF signal from terminal 601 via transformer 602. In the configuration shown in FIG. 20, since a diode is used as a non-linear element and diode bridge 606 has a symmetric circuit configuration, the RF signal and the IF signal can be converted in frequency into each other in two ways.

Another example of the conventional bidirectional frequency converter is disclosed in Japanese Patent No. 3258791. FIG. 21 illustrates a configuration of an example of a communication apparatus having the bidirectional frequency converter disclosed in Japanese Patent No. 3258791.

FIG. 21 is a diagram illustrating an operation of communication apparatus 700 at the time of reception. In FIG. 21, antenna 701 is used in common to reception and transmission and is connected to switch 702. Switch 702 connects antenna 701 to reception signal amplifier 703 and inputs a reception RF signal received by antenna 701 to reception signal amplifier 703. An output terminal of reception signal amplifier 703 is connected to switch 704. Switch 704 connects reception signal amplifier 703 to frequency converter 705 and inputs the reception RF signal amplified by reception signal amplifier 703 to frequency converter 705.

LO signal oscillator 708 generates an LO signal and the generated LO signal is input to frequency converter 705 through amplifier 706. Frequency converter 705 mixes two input signals of the reception RF signal and the LO signal to generate a reception IF signal. Switch 707 connects frequency converter 705 to reception signal output terminal 709 and outputs the reception IF signal generated by frequency converter 705 to reception signal output terminal 709.

Up to now, the operation of communication apparatus 700 at the time of reception has been described. At the time of transmission, the circuit configuration is changed so that switch 704 connects transmission signal input terminal 710 to frequency converter 705, switch 707 connects frequency converter 705 to transmission signal amplifier 711, and switch 702 connects transmission signal amplifier 711 to antenna 701. In the configuration shown in FIG. 21, communication apparatus 700 can use one frequency converter 705 in common to reception and transmission, by changing a signal path in transmission and reception by the use of switches.

Another example of the conventional bidirectional frequency converter is disclosed in Japanese Patent No. 3369396. FIG. 22 is a diagram illustrating a configuration of an example of the bidirectional frequency converter disclosed in Japanese Patent No. 3369396.

In FIG. 22, terminal 801 to which a reception RF signal is input and terminal 802 to which a transmission IF signal is input are connected to adder 803. Adder 803 outputs an added signal of the reception RF signal and the transmission IF signal. The added signal is input to frequency converter 804 and is mixed with an LO signal input from terminal 805 to generate a reception IF signal and a transmission RF signal. An output terminal of frequency converter 804 is connected to buffer amplifiers 806 and 807. Buffer amplifier 806 amplifies the generated reception IF signal and outputs the amplified reception IF signal to terminal 808 and buffer amplifier 807 amplifies the generated transmission RF signal and outputs the amplified transmission RF signal to terminal 809.

In the configuration shown in FIG. 22, one frequency converter 804 can be used in common to reception and transmission, by using adder 803 at the input side of the frequency converter and using buffer amplifiers 806 and 807 at the output side thereof.

However, in the conventional configuration disclosed in the document entitled "Fundamental and Development of Microwave Semiconductor Circuit," since a diode is used at a non-linear element, there is a problem that loss of power occurs at the time of frequency conversion, thereby causing conversion loss.

In the conventional configurations disclosed in Japanese Patent No. 3258791 and Japanese Patent No. 3369396, since the reception RF signal and the transmission IF signal are input to the same input terminal of the frequency converter and the reception IF signal and the transmission RF signal are output from the same output terminal, the input terminal and the output terminal must be matched with both frequency bands of the IF signal and the RF signal and thus a matching circuit is complicated. In addition, there is a problem that constituent components other than the frequency converter, such as switches for switching a signal path, an adder, and buffer amplifiers, are necessary for transmission and reception.

DISCLOSURE OF THE INVENTION

An object of the present invention is to provide a bidirectional frequency converter with a simple configuration capable of performing both frequency conversion from an IF signal to an RF signal and frequency conversion from an RF signal to an IF signal, in which a conversion gain can be obtained from one frequency conversion and an external circuit such as a switch and an adder is not necessary.

According to a first aspect of the invention, there is provided a bidirectional frequency converter including: a bipolar transistor; a load impedance element connected to a collector terminal of the bipolar transistor; a bias part for supplying a bias to a base terminal; a first switch for permitting and blocking power supply to the bias part; and an emitter impedance element connected to an emitter terminal, wherein an output signal of a second frequency, which is a mixture signal including an input signal of a first frequency input from a first signal terminal connected to the base terminal and a local oscillation signal input from a third signal terminal connected to the emitter terminal, is output from a second signal terminal connected to the collector terminal when the first switch is turned on and a bias is supplied, and wherein an output signal of the first frequency, which is a mixture signal including an input signal of the second frequency input from the second signal terminal and the local oscillation signal input from the third signal terminal, is output from the first signal terminal when the first switch is turned off.

According to the configuration of the bidirectional frequency converter of the invention described above, one frequency converter can carry out the frequency conversion from two kinds of frequency signals into the two kinds of frequency signals, respectively, by the use of only one power supply switch without using a switch for switching a signal path. Accordingly, it is possible to use the frequency converter in common to a transmission system and a reception system and it is possible to accomplish simplification, decrease in size, and reduction in cost of a radio unit. In addition, since a conversion gain can be obtained by using base current as an input and using collector current as an output as for the frequency conversion of the reception system, it is possible to reduce a burden on other gain stages. Accordingly, the restriction to an installation position of an amplifier can be reduced and the flexibility in design of the whole system of the radio unit can be enhanced, thereby making the design of structure easy.

The bidirectional frequency converter according to a second aspect of the invention may further include a second switch for permitting and blocking power supply to the load impedance element, and the second switch may be turned on and off in synchronization with the first switch.

Accordingly, it is possible to suppress the conversion loss of the frequency conversion when the power supply switch is turned off.

In the bidirectional frequency converter according to a third aspect of the invention, when the first frequency is a radio frequency, the second frequency may be an intermediate frequency and when the first frequency is an intermediate frequency, the second frequency may be a radio frequency.

Accordingly, the bidirectional frequency converter according to the invention can be used to perform bidirectional frequency conversion of a wireless communication apparatus.

According to a fourth aspect of the invention, there is provided a bidirectional frequency converter including a pair of the bidirectional frequency converters according to the third aspect, wherein a new first signal terminal is constructed by connecting the first signal terminals of the pair of bidirectional frequency converters to each other, and a single balance configuration is constructed by inputting differential local oscillation signals to third signal terminals of the pair of bidirectional frequency converters.

Accordingly, since the output signals from a pair of second signal terminals constitute a balance output having a phase difference of 180 degree, it is possible to obtain a relatively high conversion gain by differentially synthesizing the output signals. In addition, since the signals having a phase difference of 180 degree are input from a pair of third signal terminals, the signals output from the first signal terminal have the same phase, thereby suppressing the conversion loss.

According to a fifth aspect of the invention, there is provided a bidirectional frequency converter comprising four bidirectional frequency converters of the third aspect, wherein a first pair of signal terminals is constructed newly by connecting the first signal terminals of the first bidirectional frequency converter and the second bidirectional frequency converter among the four bidirectional frequency converters to each other and connecting the first signal terminals of the third bidirectional frequency converter and the fourth bidirectional frequency converter to each other, wherein a second pair of signal terminals is constructed newly by connecting the second signal terminals of the first bidirectional frequency converter and the fourth bidirectional frequency converter to each other and connecting the second signal terminals of the second bidirectional frequency converter and the third bidirectional frequency converter to each other, wherein a third pair of signal terminals is constructed newly by connecting the third signal terminals of the first bidirectional frequency converter and the third bidirectional frequency converter to each other and connecting the third signal terminals of the second bidirectional frequency converter and the fourth bidirectional frequency converter to each other, and wherein a double balance configuration is constructed by inputting differential local oscillation signals to the third pair of signal terminals.

Accordingly, since the signals output from the pair of second signal terminals constitute a balance output having a phase difference of 180 degree by inputting differential signals to the pair of first signal terminals, it is possible to obtain a relatively high conversion gain by differential synthesis. In addition, since the signals having a phase difference of 180 degree are input from the pair of third signal terminals, it is possible to further suppress the conversion loss by differentially synthesizing the signals output from the pair of first signal terminals.

According to a sixth aspect of the invention, there is provided a bidirectional frequency converter including: a bipolar transistor; a load impedance element connected to a collector terminal of the bipolar transistor; a first variable voltage source for supplying power to the collector terminal through the load impedance element; a bias part connected to a base terminal to supply a bias; a second variable voltage source for supplying power to the bias part; and an emitter impedance element connected to an emitter terminal, wherein when a local oscillation signal is input to a third signal terminal connected to the emitter terminal, the first variable voltage source supplies a first voltage to the collector terminal, and the second variable voltage source supplies a second voltage to the base terminal, an output signal of a second frequency, which is obtained by mixing an input signal of a first frequency input from a first signal terminal and the local oscillation signal, is output from a second signal terminal connected to the collector terminal, and wherein when a local oscillation signal is input to the third signal terminal, the first variable voltage source supplies a third voltage to the collector terminal, and the second variable voltage source supplies a fourth voltage to the base terminal, an output signal of the first frequency, which is obtained by mixing an input signal of the second frequency input from the second signal terminal and the local oscillation signal, is output from the first signal terminal.

Accordingly, the conversion loss when a signal is input from the second signal terminal can be reduced in the relatively wide range of the local oscillation signal level.

In the bidirectional frequency converter according to a seventh aspect of the invention, the third voltage of the first variable voltage source and the fourth voltage of the second variable voltage source may be set to voltages not turning on the bipolar transistor.

Accordingly, since the bipolar transistor satisfactorily operates as a diode, it is possible to convert a frequency of the input signal from the second signal terminal to the first signal terminal with a small conversion loss.

In the bidirectional frequency converter according to an eighth aspect of the invention, when the first frequency is a radio frequency, the second frequency is an intermediate frequency, and when the first frequency is an intermediate frequency, the second frequency is a radio frequency.

Accordingly, the bidirectional frequency converter according to the invention can be also used to perform a bidirectional frequency conversion of a wireless communication apparatus.

According to a ninth aspect of the invention, there is provided a bidirectional frequency converter including a pair of the bidirectional frequency converters of the eighth aspect, wherein a new first variable voltage source is constructed by using the first variable voltage sources of the pair of bidirectional frequency converters in common, a new second variable voltage source is constructed by using the second variable voltage sources in common, a new first signal terminal is constructed by connecting the first signal terminals of the pair of bidirectional frequency converters to each other, and a single balance configuration is constructed by inputting differential local oscillation signals to the third signal terminals of the pair of bidirectional frequency converters.

Accordingly, since the output signals from the pair of second signal terminals constitute a balance output having a phase difference of 180 degree, it is possible to obtain a relatively high conversion gain by differential synthesis. In addition, since the signals having a phase difference of 180 degree are input from a pair of third signal terminals, the signals output from the first signal terminals have the same phase, thereby suppressing the conversion loss.

According to a tenth aspect of the invention, there is provided a bidirectional frequency converter comprising four bidirectional frequency converters of the eighth aspect, wherein a new first variable voltage source is constructed by using the first variable voltage sources of the four bidirectional frequency converters in common, a new second variable voltage source is constructed by using the second variable voltage sources of the four bidirectional frequency converters in common, among the four bidirectional frequency converters, a new first pair of signal terminals is constructed by connecting the first signal terminals of the first bidirectional frequency converter and the second bidirectional frequency converter to each other and connecting the first signal terminals of the third bidirectional frequency converter and the fourth bidirectional frequency converter to each other, a new second pair of signal terminals is constructed by connecting the second signal terminals of the first bidirectional frequency converter and the fourth bidirectional frequency converter to each other and connecting the second signal terminals of the second bidirectional frequency converter and the third bidirectional frequency converter to each other, a new third pair of signal terminals is constructed by connecting the third signal terminals of the first bidirectional frequency converter and the third bidirectional frequency converter to each other and connecting the third signal terminals of the second bidirectional frequency converter and the fourth bidirectional frequency converter to each other, and a double balance configuration is constructed by inputting differential local oscillation signals to the third pair of signal terminals.

Accordingly, when differential signals are input to the first pair of signal terminals, the signals output from the second pair of signal terminals constitute a balance output having a phase difference of 180 degree, so it is possible to obtain a relatively high conversion gain by differential synthesis. In addition, since the signals having a phase difference of 180 degree are input from the third pair of signal terminals, the signals output from the first pair of signal terminals are differentially synthesized, thereby suppressing the conversion loss.

The bidirectional frequency converter according to an eleventh aspect of the invention is the bidirectional frequency converter of any one of the first to tenth aspects in which the load impedance element may be one of a load resistor and a load inductor.

The bidirectional frequency converter according to a twelfth aspect of the invention is the bidirectional frequency converter of any one of the first to eleventh aspects, in which the load impedance element may be a variable load impedance element and a phase of an output signal from the first signal terminal and a gain of an output signal from the second signal terminal may be controlled by varying the impedance value of the variable load impedance element.

Accordingly, the bidirectional frequency converter according to the invention can easily control the gain of the output signal.

The bidirectional frequency converter according to a thirteenth aspect of the invention is the bidirectional frequency converter of any one of the first to twelfth aspects, in which the emitter impedance element may be one of an emitter resistor and an emitter inductor.

The bidirectional frequency converter according to a fourteenth aspect of the invention is the bidirectional frequency converter of any one of the first to thirteenth aspects, in which the emitter impedance element may be a variable emitter impedance element and power of the output signal may be controlled by the impedance value of the variable emitter impedance element.

Accordingly, the bidirectional frequency converter according to the invention can easily control the gain of the output signal.

The bidirectional frequency converter according to a fifteenth aspect of the invention is the bidirectional frequency converter of any one of the fourth and ninth aspects, in which the emitter impedance element of the pair of bidirectional frequency converters or the four bidirectional frequency converters may be a variable emitter impedance element, the load impedance element may be a variable load impedance element, the bidirectional frequency converter may further include a power distributor for distributing power of a signal inputting to and outputting from the new first signal terminal and a controller for outputting a control signal corresponding to the signal distributed by the power distributor, and a phase of an output signal may be controlled by varying the impedance values of the variable emitter impedance element and the variable load impedance element by the use of the control signal.

Accordingly, since the power distributor detects the input signal level or the output signal level and changes the impedance value of the load impedance element, it is possible to automatically adjust the conversion gain and to keep the output at a predetermined level.

The bidirectional frequency converter according to a sixteenth aspect of the invention is the bidirectional frequency converter of any one of the fifth and tenth aspects, in which the emitter impedance element of the four bidirectional frequency converters may be a variable emitter impedance element, the load impedance element may be a variable load impedance element, the bidirectional frequency converter may further include a power distributor for distributing power of a signal inputting to and outputting from the new first signal terminal and a controller for outputting a control signal corresponding to the signal distributed by the power distributor, and a phase of an output signal may be controlled by varying the impedance values of the variable emitter impedance element and the variable load impedance element by the use of the control signal.

Accordingly, since the power distributor detects the input signal level or the output signal level and changes the impedance value of the load impedance element, it is possible to automatically adjust the conversion gain and to keep the output at a predetermined level.

The bidirectional frequency converter according to a seventeenth aspect of the invention is the bidirectional frequency converter of any one of the first to sixteenth aspects, in which an FET (Field Effect Transistor) may be used instead of the bipolar transistor, the base terminal is replaced with a gate terminal of the FET, the emitter terminal is replaced with a source terminal of the FET, and the collector terminal is replaced with a drain terminal of the FET. Accordingly, it is possible to integrate the converter elements in a smaller size.

According to an eighteenth aspect of the invention, there is provided a radio apparatus including: an antenna; a bidirectional amplifier connected to the antenna; a bidirectional frequency converter of any one of the first to seventeenth aspects connected to the antenna through the bidirectional amplifier; and a local oscillator connected to the bidirectional frequency converter so as to input a local oscillation signal thereto.

Accordingly, in the radio apparatus according to the invention, one frequency converter can carry out the frequency conversion from two kinds of frequency signals into the two kinds of frequency signals, respectively. Specifically, since the conversion from the IF signal to the RF signal and the conversion from the RF signal to the IF signal can be carried out by the use of only the power supply switch, the radio unit can be simplified and decreased in size. Accordingly, it is possible to accomplish simplification, decrease in size, and reduction in cost of a radio unit.

In the radio apparatus according to a nineteenth aspect of the invention, the bidirectional amplifier of the eighteenth aspect may include: a 3-terminal switch; a first amplifier of which an input terminal is connected to one connection terminal of the 3-terminal switch; and a second amplifier of which an output terminal is connected to the other connection terminal of the 3-terminal switch. Here, the antenna may be connected to a common terminal of the 3-terminal switch and an output terminal of the first amplifier and an input terminal of the second amplifier may be connected to the bidirectional frequency converter.

The radio apparatus can be implemented by the use of conventional preamplifiers and switches.

The radio apparatus according to a twentieth aspect of the invention may further include a power amplifier and a 2-terminal switch disposed between the antenna and the bidirectional amplifier. Here, an output terminal of the power amplifier and one terminal of the 2-terminal switch may be connected to the antenna, and an input terminal of the power amplifier and the other terminal of the 2-terminal switch may be connected to the bidirectional amplifier according to the invention.

Accordingly, it is possible to embody a radio apparatus having high power only at the time of transmission.

As described above, according to the bidirectional frequency converter and the radio apparatus according to the invention, the conversion from the IF signal to the RF signal and the conversion from the RF signal to the IF signal can be carried out by one frequency converter without using an external circuit such as a switch for switching a signal path. In addition, since the frequency converter can be used in common to the transmission system and the reception system in a radio unit for a radio system of a time division duplex (TDD) type of performing the transmission and reception in a time division manner, it is possible to accomplish simplification, decrease in size, and reduction in cost of the radio unit.

Since a conversion gain can be obtained from one frequency conversion, it is possible to reduce a burden on other gain stages. Accordingly, the flexibility in design of the whole system of the radio unit is enhanced, thereby making the design of structure easy.

REFERENCE NUMERALS

Figure 1A:
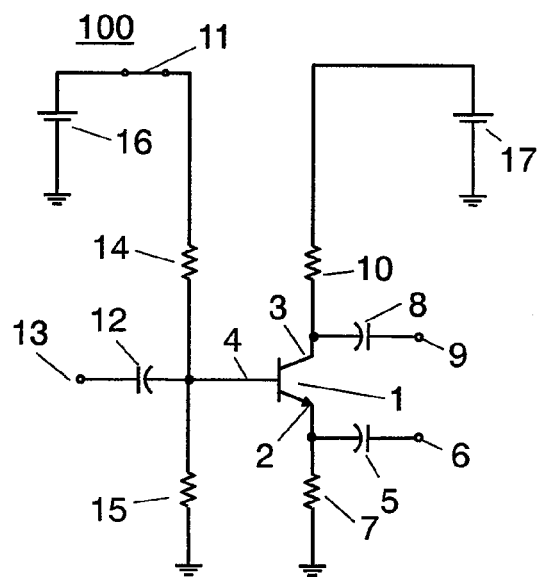
FIG. 1A is a circuit diagram illustrating a bidirectional frequency converter according to a first embodiment of the present invention at the time of forward conversion.

1: BIPOLAR TRANSISTOR
2: EMITTER TERMINAL
3: COLLECTOR TERMINAL
4: BASE TERMINAL
5, 8, 12: CAPACITOR
6, 6a, 6b: LO TERMINAL
7: EMITTER-SIDE RESISTOR
9, 9a, 9b, 33: IF TERMINAL
10: COLLECTOR-SIDE RESISTOR
11: POWER SUPPLY SWITCH
13, 13a, 13b: RF TERMINAL
14, 15: BASE BIAS RESISTOR
16, 17: VOLTAGE SOURCE
18: VARIABLE EMITTER-SIDE RESISTOR
19: VARIABLE COLLECTOR-SIDE RESISTOR
20: POWER DISTRIBUTOR
21, 22: CONTROLLER
30, 701: ANTENNA
31: BIDIRECTIONAL AMPLIFIER
32: LO SIGNAL OSCILLATOR
34: 3-TERMINAL SWITCH
35, 36: AMPLIFIER
37: 2-TERMINAL SWITCH
38: POWER AMPLIFIER
40, 41: VARIABLE VOLTAGE SOURCE
100, 200, 250, 300, 301, 401, 402, 403, 404, 411, 412, 413, 414, 440: BIDIRECTIONAL FREQUENCY CONVERTER
400, 410: SINGLE-BALANCE BIDIRECTIONAL FREQUENCY CONVERTER
420, 430: DOUBLE-BALANCE BIDIRECTIONAL FREQUENCY CONVERTER
500, 510, 520: RADIO APPARATUS
601, 603, 605, 801, 802, 805, 808, 809: TERMINAL
602, 604: TRANSFORMER
606: DIODE BRIDGE
700: COMMUNICATION APPARATUS
702, 704, 707: SWITCH
703: RECEPTION SIGNAL AMPLIFIER
705, 804: FREQUENCY CONVERTER
706: AMPLIFIER
708: LO SIGNAL OSCILLATOR
709: RECEPTION SIGNAL OUTPUT TERMINAL
710: TRANSMISSION SIGNAL INPUT TERMINAL
711: TRANSMISSION SIGNAL AMPLIFIER
803: ADDER
806, 807: BUFFER AMPLIFIER

BEST MODE FOR CARRYING OUT THE INVENTION

Hereinafter, embodiments of the present invention will be described with reference to the drawings. In the following description, frequency conversion of converting down an RF signal into an IF signal is referred to as forward conversion, and frequency conversion of converting up an IF signal into an RF signal is referred to as reverse conversion. In the drawings, like elements are denoted by like reference numerals.

First Embodiment

Figure 1B:
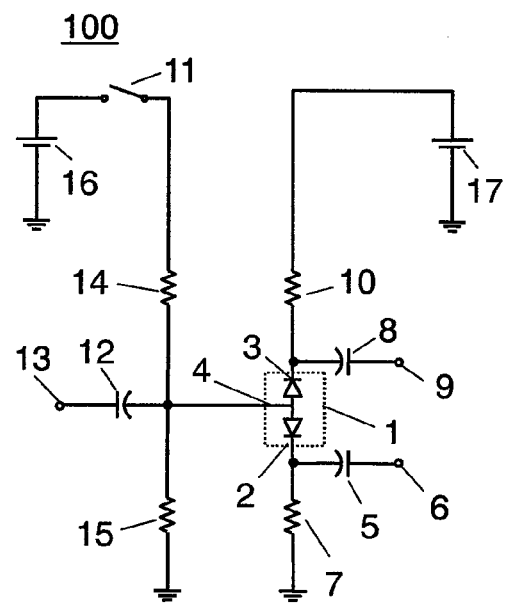
FIG. 1B is an equivalent circuit diagram of the bidirectional frequency converter according to the first embodiment of the invention at the time of reverse conversion.

FIGS. 1A and 1B are circuit diagrams illustrating bidirectional frequency converter 100 according to a first embodiment of the invention. FIG. 1A is a circuit diagram of bidirectional frequency converter 100 at the time for forward conversion and FIG. 1B is a circuit diagram of bidirectional frequency converter 100 at the time of reverse conversion.

In FIGS. 1A and 1B, NPN-type bipolar transistor 1 has emitter terminal 2, collector terminal 3, and base terminal 4. Emitter terminal 2 is connected to LO terminal 6 for inputting an LO signal through capacitor 5 and is grounded through emitter-side resistor 7. Collector terminal 3 is connected to IF terminal 9 for inputting and outputting an IF signal through capacitor 8 and is also connected to voltage source 17 through collector-side resistor 10. Collector-side resistor 10 corresponds to the load impedance element.

Base terminal 4 is connected to RF terminal 13 for inputting and outputting an RF signal through capacitor 12 and is also connected base bias resistor 14 and base bias resistor 15. Base bias resistor 14 is connected to voltage source 16 through power supply switch 11 and base bias resistor 15 is grounded, thereby applying a base bias to base terminal 4. The configuration that base bias resistors 14 and 15 apply the base bias to base terminal 4 corresponds to the bias part according to the invention. Power supply switch 11 switches on and off the connection between voltage source 16 and base bias resistor 14. Power supply switch 11 corresponds to the first switch according to the invention.

In the first embodiment, as specific examples of frequencies, the frequency of the RF signal is 2.45 GHz, the frequency of the LO signal is 1.88 GHz, and the frequency of the IF signal is 570 MHz, but the frequencies of the signals are not limited to those described above.

A forward conversion operation is now described with reference to FIG. 1A.

Power supply switch 11 is turned on at the time of forward conversion. Paying attention to an RF signal, the RF signal is input to base terminal 4 through capacitor 12 and then becomes collector current flowing in collector terminal 3 as an amplified RF signal. Paying attention to an LO signal, the LO signal is input to emitter terminal 2 through capacitor 5 and then becomes collector current flowing in collector terminal 3 as an amplified LO signal. At this time, a mixture signal including the amplified RF signal and the amplified LO signal is output through collector terminal 3 by means of non-linearity of bipolar transistor 1. That is, bipolar transistor 1 outputs the mixture signal including the signal of 570 MHz and the signal of 4.33 GHz from the RF signal (2.45 GHz) and the LO signal (1.88 GHz), but the bidirectional frequency converter can select the IF signal of 570 MHz by adding a filter (not shown) for transmitting the low-frequency mixture signal to IF terminal 9. In the example described above, the RF signal corresponds to the input signal of the first frequency according to the invention and the IF signal corresponds to the output signal of the second frequency.

A reverse conversion operation is now described with reference to FIG. 1B.

FIG. 1B is an equivalent circuit diagram in which bipolar transistor 1 is expressed as a diode at the time of reverse conversion of bidirectional frequency converter 100.

In FIG. 1B, power supply switch 11 is turned off at the time of reverse conversion. Accordingly, since the base bias is not applied, bipolar transistor 1 does not operate as a transistor, but operates as a diode.

Bipolar transistor 1 can be expressed as two diodes connected between base terminal 4 and emitter terminal 2 and between base terminal 4 and collector terminal 3. Accordingly, the IF signal input from IF terminal 9 and the LO signal input from LO terminal 6 are mixed by the diodes and the mixed signal is output to RF terminal 13. Here, bipolar transistor 1 outputs the mixture signal including the signal of 1.31 GHz and the signal of 2.45 GHz from the IF signal (570 MHz) and the LO signal (1.88 GHz), but the bidirectional frequency converter can select the RF signal of 2.45 GHz by adding a filter (not shown) for transmitting the high-frequency mixture signal to RF terminal 13. In the example described above, the RF signal corresponds to the output signal of the first frequency according to the invention and the IF signal corresponds to the input signal of the second frequency.

An analysis example of the bidirectional frequency converter according to the first embodiment is now described. At this time, the analysis is performed in the state that voltage source 16 is set to 3V and potentials of the terminals of bipolar transistor 1 are similar to those of a conventional emitter grounded amplifier. Here, the frequency of the RF signal is 2.45 GHz, the frequency of the LO signal is 1.88 GHz, and the frequency of the IF signal is 570 MHz.

Figure 3A:
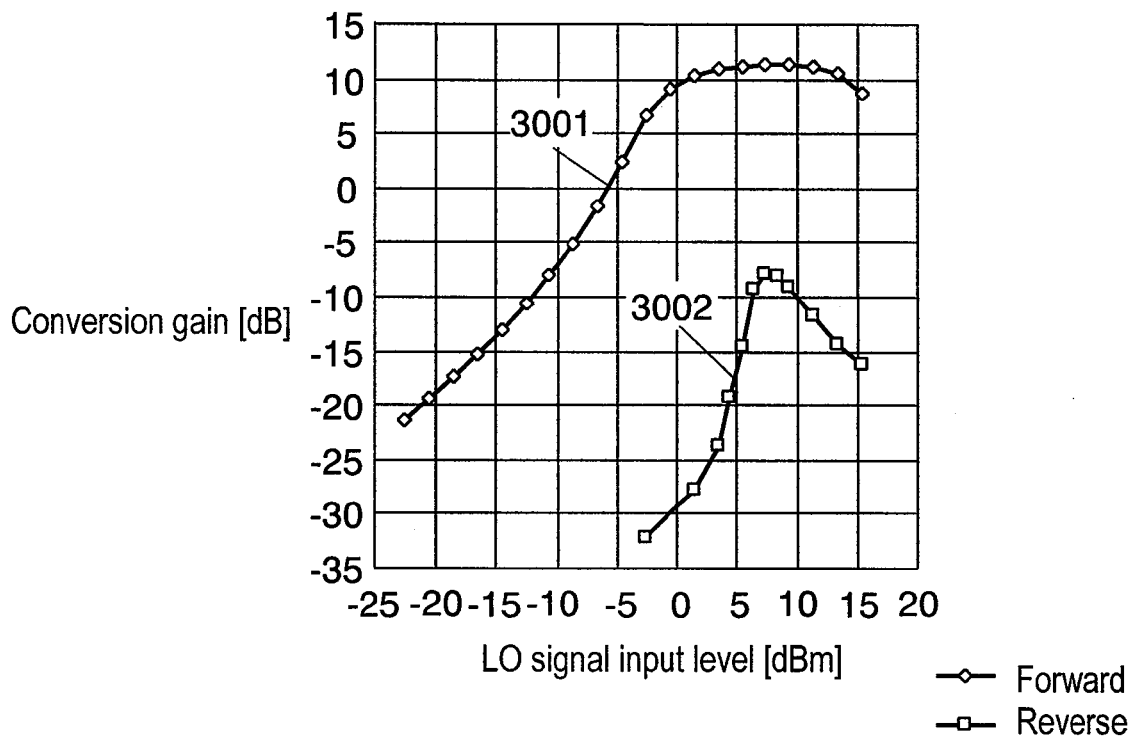
FIG. 3A is a characteristic diagram illustrating an analysis result of a conversion gain with respect to an LO signal level in the bidirectional frequency converter according to the first embodiment of the invention.

FIG. 3A shows an analysis result of a conversion gain with respect to the input level of the LO signal according to the first embodiment. In FIG. 3A, forward conversion gain characteristic 3001 indicates that the conversion gain of +11.3 dB is obtained when the LO signal level is +8 dBm and reverse conversion gain characteristic 3002 indicates that the conversion loss of 15 dB is obtained.

In the bidirectional frequency converter according to the first embodiment described above, the conversion from the IF signal into the RF signal and the conversion from the RF signal into the IF signal can be embodied by one frequency converter by the use of only the power supply switch without using a switch for switching a signal path and the like. Accordingly, it is possible to accomplish simplification, decrease in size, and reduction in cost of the radio unit. Since a conversion gain can be imposed on the forward frequency conversion, it is possible to reduce a burden on other gain stages. Accordingly, the restriction to an installation position of an amplifier is alleviated and the flexibility in design of the whole system of the radio unit is enhanced, thereby making the design of structure easy.

Matching circuits may be added to RF terminal 13, LO terminal 6, and IF terminal 9 of the bidirectional frequency converter according to the invention, respectively. In this case, the matching circuit may be a matching circuit set to cope with the forward conversion or a matching circuit set to cope with the reverse conversion. The matching circuits may be varied or switched in accordance with the states at the time of forward conversion and at the time of reverse conversion.

In the first embodiment, by inputting and outputting the IF signal to and from the collector terminal and inputting and outputting the RF signal to and from the base terminal, the RF signal is converted into the IF signal by the use of the forward conversion and the IF signal is converted into the RF signal by the use of the reverse conversion. However, in addition thereto, by inputting and outputting the RF signal to and from the collector terminal and inputting and outputting the IF signal to and from the base terminal, the IF signal may be converted into the RF signal by the use of the forward conversion and the RF signal may be converted into the IF signal by the use of the reverse conversion. In addition, by inputting and outputting a first intermediate frequency signal (IF1 signal) to and from the collector terminal and inputting and outputting a second intermediate frequency signal (IF2 signal) to and from the base terminal, the IF2 signal may be converted into the IF1 signal by the use of the forward conversion and the IF1 signal may be converted into the IF2 signal by the use of the reverse conversion.

In the first embodiment, the LO signal of the same frequency is used for the forward conversion and the reverse conversion, but LO signals of different frequencies may be used at the time of the forward conversion and the reverse conversion, respectively.

In the first embodiment, the NPN-type bipolar transistor is used, but a PNP-type bipolar transistor may be used.

Figure 13A:
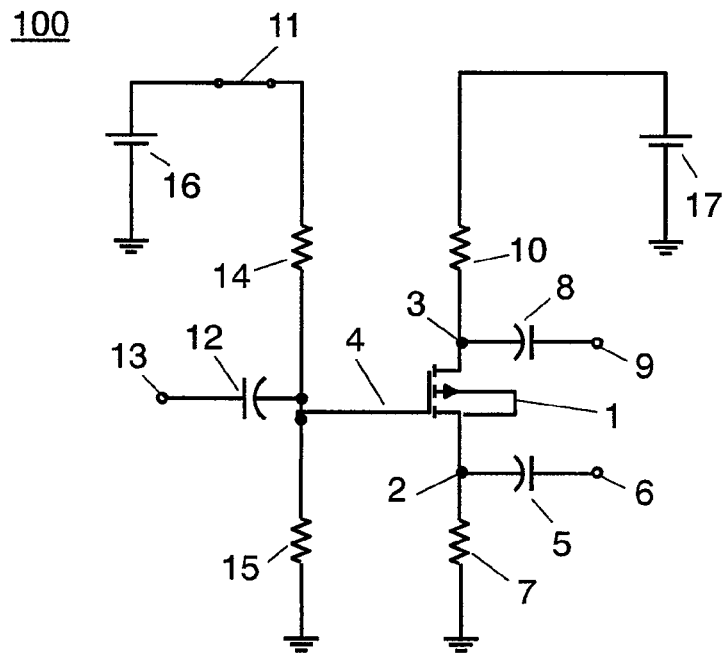
FIG. 13A is a circuit diagram illustrating a bidirectional frequency converter according to another example of the first embodiment of the invention.

In the first embodiment, the bipolar transistor is used, but as shown in FIG. 13A, a FET may be used in which the base terminal is replaced with a gate terminal, the emitter terminal is replaced with a source terminal, and the collector terminal is replaced with a drain terminal. Accordingly, it is possible to further reduce the size.

In the first embodiment, a current feedback type is exemplified that two base bias resistors are used for the base bias of the bipolar transistor, but other configurations may be used.

In the first embodiment, an inductor may be used instead of the emitter-side resistor or an inductor may be used instead of the collector-side resistor.

In the first embodiment, a switch for mechanically switching the ON state and the OFF state is exemplified as the power supply switch, but an FET transistor may be used to switch on or off connection between a source and a drain by the use of a gate voltage.

The bidirectional frequency converter according to the first embodiment may be used as a part of an integrated circuit and may be used as a package component.

Second Embodiment

Figure 2A:
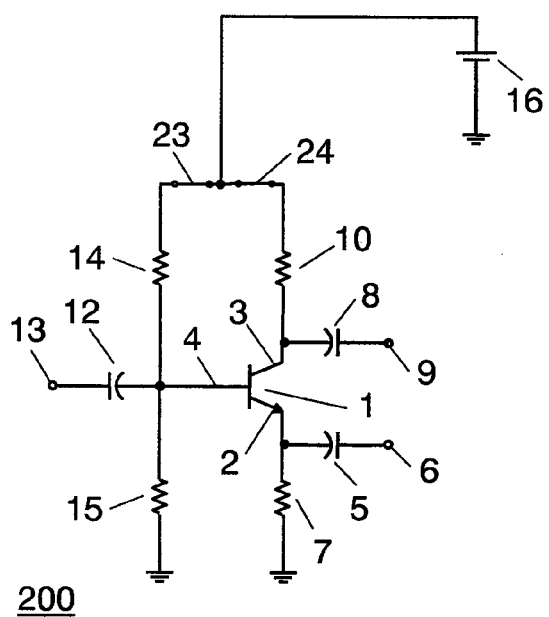
FIG. 2A is a circuit diagram illustrating a bidirectional frequency converter according to a second embodiment of the invention at the time of forward conversion.
Figure 2B:
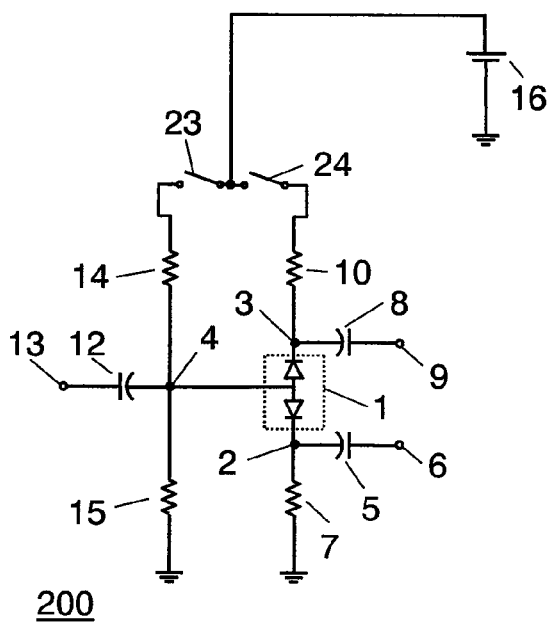
FIG. 2B is an equivalent circuit diagram of the bidirectional frequency converter according to the second embodiment of the invention at the time of reverse conversion.

FIGS. 2A and 2B are circuit diagrams illustrating bidirectional frequency converter 200 according to a second embodiment of the invention. FIG. 2A is a circuit diagram of bidirectional frequency converter 200 at the time of forward conversion and FIG. 2B is a circuit diagram of bidirectional frequency converter 200 at the time of reverse conversion. Only points different from the first embodiment are described below.

In the bidirectional frequency converter according to the second embodiment, voltage source 17 according to the first embodiment is omitted and voltage source 16 is used in common.

In FIG. 2A, power supply switches 23 and 24 are turned on at the time of forward conversion and a base bias is supplied through base bias resistor 14 and base bias resistor 15 from one voltage source 16. A voltage is supplied to a load resistor through collector-side resistor 10. At this time, the operation is similar to that of the first embodiment. Power supply switch 23 corresponds to the first switch according to the invention and power supply switch 24 corresponds to the second switch according to the invention.

The reverse conversion operation is now described with reference to FIG. 2B.

At the time of reverse conversion, since power supply switches 23 and 24 are turned off, collector terminal 3 is in the floating state. In addition, since the base bias is not applied, bipolar transistor 1 can not operate as a transistor, but operates as a diode.

FIG. 2B is an equivalent circuit diagram in which bipolar transistor 1 is expressed as a diode at the time of the reverse conversion of bidirectional frequency converter 200.

As shown in FIG. 2B, bipolar transistor 1 can be expressed as two diodes connected between base terminal 4 and emitter terminal 2 and between base terminal 4 and collector terminal 3, respectively. Accordingly, the mixture signal in which the IF signal input from IF terminal 9 and the LO signal input from LO terminal 6 are mixed in the diodes is output from RF terminal 13. Here, bipolar transistor 1 outputs the mixture signal including the signal of 1.31 GHz and the signal of 2.45 GHz from the IF signal (570 MHz) and the LO signal (1.88 GHz), but the bidirectional frequency converter can select the RF signal of 2.45 GHz by adding a filter (not shown) for transmitting the high-frequency side mixture signal to RF terminal 13.

An analysis example of the bidirectional frequency converter according to the second embodiment is now described with reference to FIG. 3B. Similarly to the first embodiment, the analysis is performed in the state that voltage source 16 is set to 3V and potentials of the terminals of bipolar transistor 1 are similar to those of a conventional emitter grounded amplifier. Here, the frequency of the RF signal is 2.45 GHz, the frequency of the LO signal is 1.88 GHz, and the frequency of the IF signal is 570 MHz.

Figure 3B:
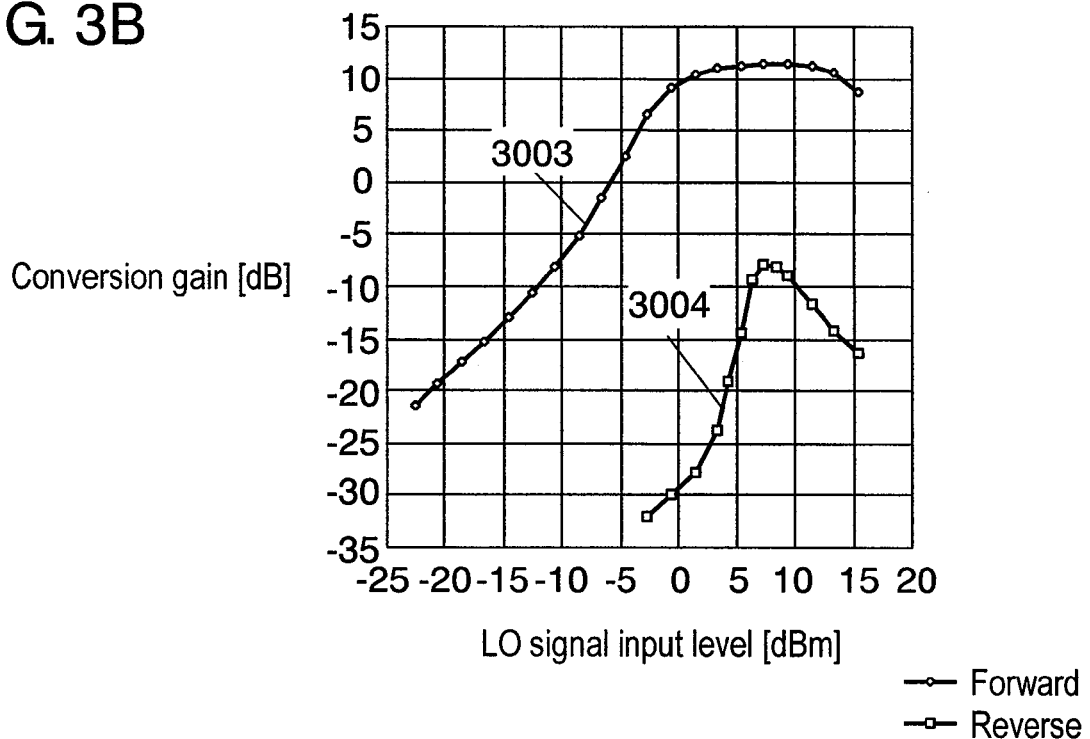
FIG. 3B is a characteristic diagram illustrating an analysis result of a conversion gain with respect to an LO signal level in the bidirectional frequency converter according to the second embodiment of the invention.

In FIG. 3B, forward conversion gain characteristic 3003 indicates that the conversion gain of +11.3 dB is obtained when the LO signal level is +8 dBm, and reverse conversion gain characteristic 3004 indicates that the conversion loss of 8.0 dB is obtained. It can be seen that the minimum reverse conversion loss of the bidirectional frequency converter according to the second embodiment is smaller than that of the first embodiment.

In the bidirectional frequency converter according to the second embodiment described above, in addition to the advantages of the first embodiment, it is also possible to suppress the conversion loss at the time of reverse frequency conversion, that is, frequency conversion of a transmission system.

Figure 13B:
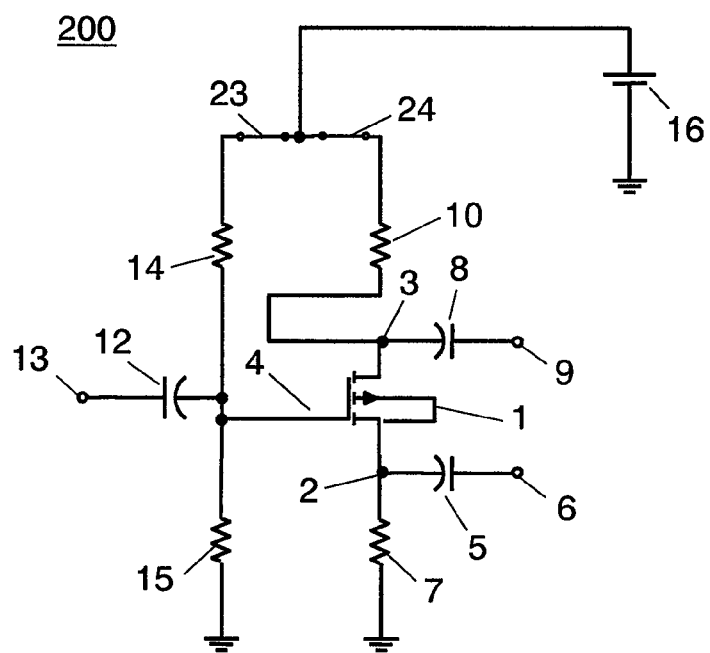
FIG. 13B is a circuit diagram illustrating a bidirectional frequency converter according to another example of the second embodiment of the invention.

In the second embodiment, the bipolar transistor is used, but as shown in FIG. 13B, an FET may be used in which the base terminal is replaced with a gate terminal, the emitter terminal is replaced with a source terminal, and the collector terminal is replaced with a drain terminal.

Third Embodiment

Figure 16A:
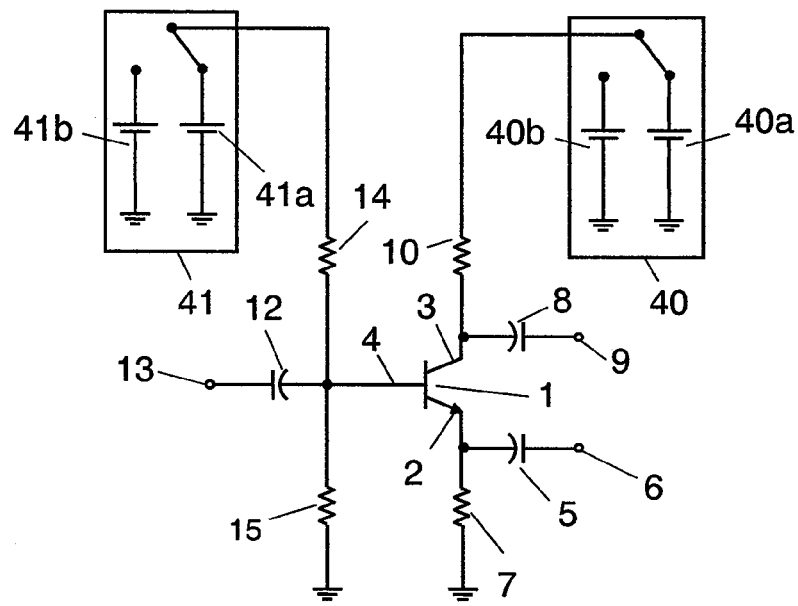
FIG. 16A is a circuit diagram illustrating a bidirectional frequency converter according to a third embodiment of the invention at the time of forward conversion.
Figure 16B:
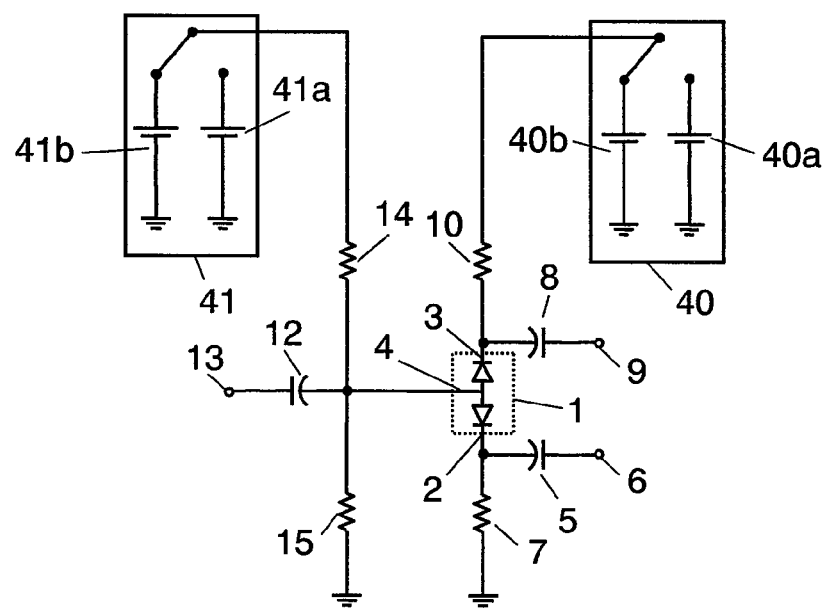
FIG. 16B is an equivalent circuit diagram of the bidirectional frequency converter according to the third embodiment of the invention at the time of reverse conversion.

FIGS. 16A and 16B are circuit diagrams illustrating bidirectional frequency converter 250 according to a third embodiment of the invention. FIG. 16A is a circuit diagram of bidirectional frequency converter 250 at the time of forward conversion and FIG. 16B is an equivalent circuit diagram of bidirectional frequency converter 250 at the time of reverse conversion. Only points different from the first embodiment are described below.

In the bidirectional frequency converter according to the third embodiment, variable voltage source 40 instead of voltage source 17 in the first embodiment is connected to collector-side resistor 10 and variable voltage source 41 instead of voltage source 16 and power supply switch 11 in the first embodiment is connected to base bias resistor 14. In addition, a circuit for switching a plurality of voltage sources is used as examples of variable voltage sources 40 and 41, but the invention is not limited to it. Variable voltage source 40 corresponds to the first variable voltage source according to the invention and variable voltage source 41 corresponds to the second variable voltage source.

The forward conversion operation is now described with reference to FIG. 16A.

In FIG. 16A, at the time of forward conversion, variable voltage source 40 applies forward collector-side potential 40a to collector-side resistor 10 and variable voltage source 41 applies forward base-side potential 41a to base bias resistor 14. Forward collector-side potential 40a and forward base-side potential 41a correspond to the first voltage and the second voltage according to the invention, respectively.

Paying attention to the RF signal, the RF signal is input to base terminal 4 through capacitor 12 and then becomes collector current flowing in collector terminal 3 as an amplified RF signal. Paying attention to the LO signal, the LO signal is input to emitter terminal 2 through capacitor 5 and then becomes collector current flowing in collector terminal 3 as an amplified LO signal. At this time, a mixture signal including the amplified RF signal and the amplified LO signal is output through collector terminal 3 by means of non-linearity of bipolar transistor 1. That is, bipolar transistor 1 outputs the mixture signal including the signal of 570 MHz and the signal of 4.33 GHz from the RF signal (2.45 GHz) and the LO signal (1.88 GHz). The bidirectional frequency converter can select the IF signal of 570 MHz by adding a filter (not shown) for transmitting the low-frequency mixture signal to IF terminal 9.

The reverse conversion operation is now described with reference to FIG. 16B.

At the time of reverse conversion, variable voltage source 40 applies reverse collector-side potential 40b to collector-side resistor 10 and variable voltage source 41 applies reverse base-side potential 41b to base bias resistor 14. Reverse collector-side potential 40b and reverse base-side potential 41b correspond to the third voltage and the fourth voltage, respectively, according to the invention. Reverse base-side potential 41b is set to a potential such that base potential 4 does not turn on bipolar transistor 1, that is, a potential higher than reverse collector-side potential 40b so that the voltage difference is 0.6 to 0.7 volt. Accordingly, bipolar transistor 1 cannot operate as a transistor, but operates as a diode, with reverse collector-side potential 40b and reverse base-side potential 41b. FIG. 16B is an equivalent circuit diagram in which bipolar transistor 1 is expressed as a diode at the time of reverse conversion of bidirectional frequency converter 250. At this time, the operation is similar to that of the first embodiment 1.

An analysis example of the bidirectional frequency converter according to the third embodiment is now described. For example, forward collector-side potential 40a and forward base-side potential 41a are set to 3V, reverse collector-side potential 40b is set to 0V, and reverse base-side potential 41b is set to 0.8V. The analysis is performed in the state that the potentials of the terminals of bipolar transistor 1 are similar to those of a conventional emitter grounded amplifier. Similarly to the first embodiment, the frequency of the RF signal is 2.45 GHz, the frequency of the LO signal is 1.88 GHz, and the frequency of the IF signal is 570 MHz.

Figure 17:
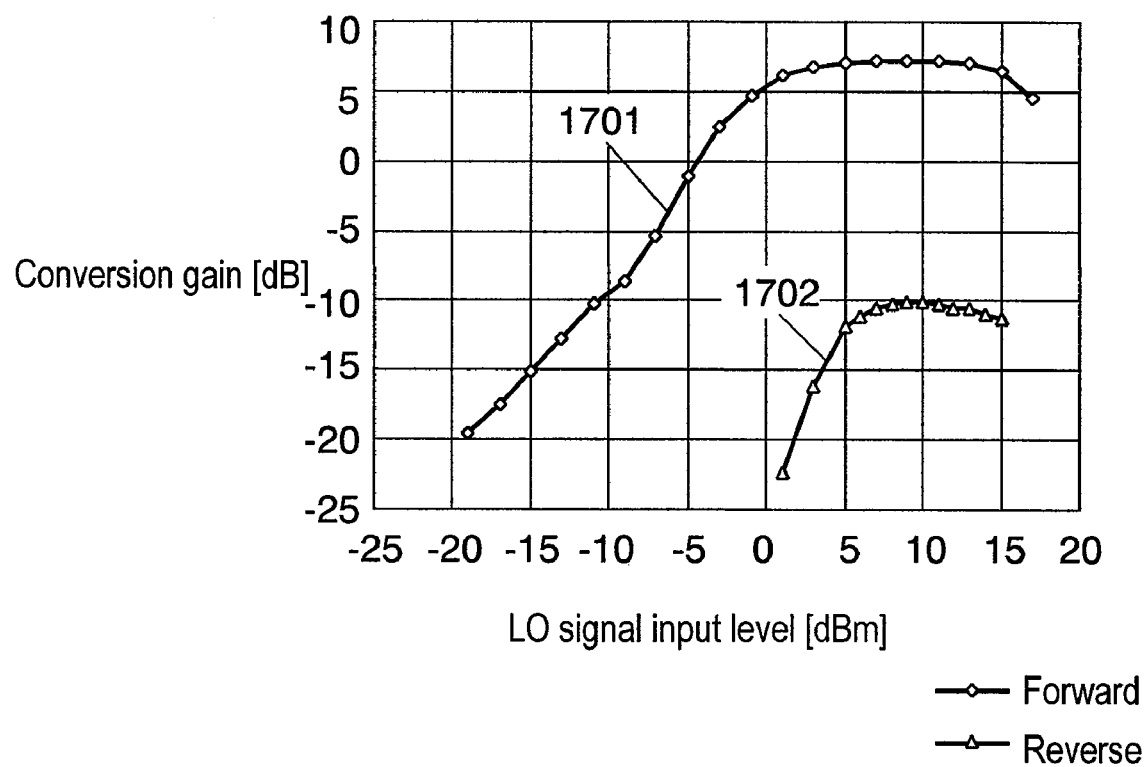
FIG. 17 is a characteristic diagram illustrating an analysis result of a conversion gain with respect to a LO signal level in the bidirectional frequency converter according to the third embodiment of the invention.

FIG. 17 shows an analysis result of a conversion gain with respect to the input level of the LO signal. In FIG. 17, forward conversion gain characteristic 1701 is not greatly different from the first embodiment or the second embodiment, but reverse conversion gain characteristic 1702 indicates that the conversion loss of the reverse conversion is 10 dB when the LO signal level is in the range of +7 to +13 dBm.

In the bidirectional frequency converter according to the third embodiment described above, in addition to the advantages of the first embodiment, it is possible to maintain the state that the conversion loss is low in the wide range of the LO signal level.

Fourth Embodiment

In a fourth embodiment, a bidirectional frequency converter in which a function of adjusting a conversion gain and phase of an output signal is added to the bidirectional frequency converter according to the second embodiment is explained. Only points different from the second embodiment are described below.

Figure 4A:
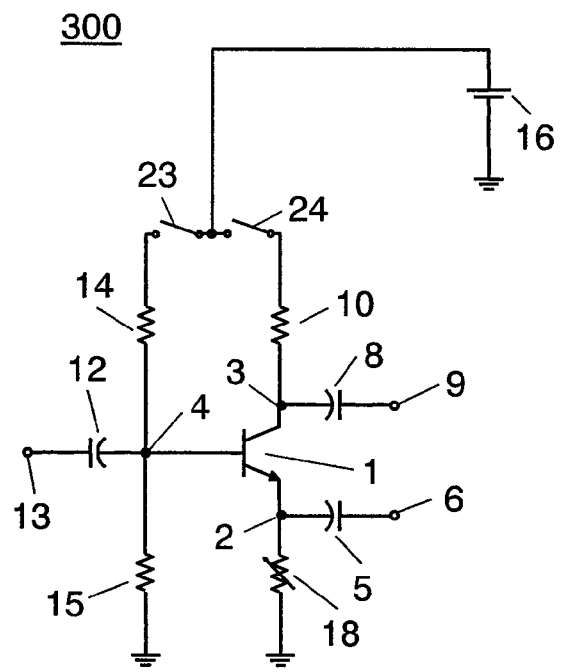
FIG. 4A is a circuit diagram illustrating a bidirectional frequency converter according to a fourth embodiment of the invention.

FIG. 4A is a circuit diagram illustrating bidirectional frequency converter 300 according to the fourth embodiment of invention. The fourth embodiment is different from the second embodiment, in that variable emitter-side resistor 18 instead of emitter-side resistor 7 is connected to emitter terminal 2 of bipolar transistor 1.

Accordingly, by varying a resistance value of variable emitter-side resistor 18, it is possible to control the conversion gain of the forward conversion. That is, when the resistance value of variable emitter-side resistor 18 decreases, the conversion gain of the forward conversion increases and when the resistance value of variable emitter-side resistor 18 increases, the conversion gain of the forward conversion decreases.

By varying the resistance value of variable emitter-side resistor 18 at the time of reverse conversion, it is possible to control the conversion loss of the reverse conversion and the phase of the RF signal to be output. That is, when the resistance value of variable emitter-side resistor 18 decreases, the conversion loss of the reverse conversion increases and thus the phase of the RF signal to be output lags. When the resistance value of variable emitter-side resistor 18 increases, the conversion loss of the reverse conversion decreases, and thus the RF signal to be output advances in phase.

In the bidirectional frequency converter according to the fourth embodiment described above, it is possible to easily control the gain of the output signal.

Figure 4B:
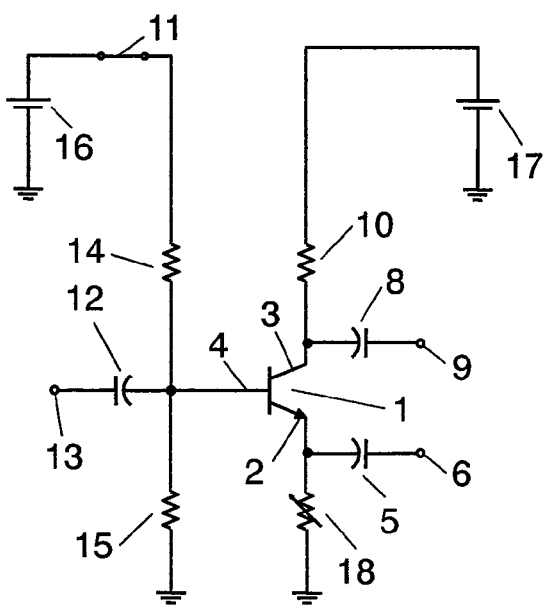
FIG. 4B is a circuit diagram illustrating the bidirectional frequency converter according to the fourth embodiment of the invention.
Figure 4C:
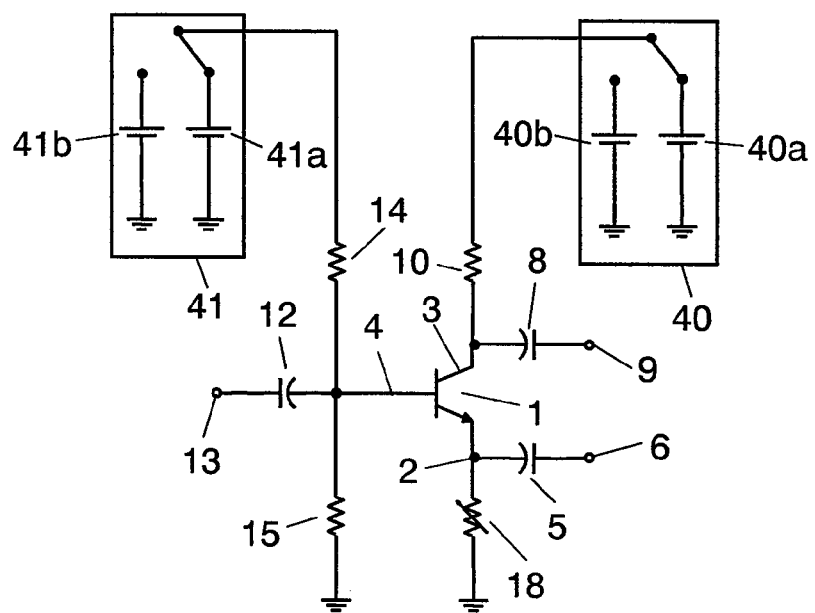
FIG. 4C is a circuit diagram illustrating the bidirectional frequency converter according to the fourth embodiment of the invention.

In the fourth embodiment, the collector-side resistor and the base bias resistor are connected to a common voltage source, but similarly to the bidirectional frequency converter according to the first embodiment, the collector-side resistor and the base bias resistor may be connected to different voltage sources. A circuit diagram of the bidirectional frequency converter at this time is shown in FIG. 4B. Alternatively, similarly to the bidirectional frequency converter according to the third embodiment, the collector-side resistor and the base bias resistor may be connected to different variable voltage sources. A circuit diagram of the bidirectional frequency converter at this time is shown in FIG. 4C. Specifically, at the time of forward conversion, variable voltage source 40 applies forward collector-side potential 40a to collector-side resistor 10 and variable voltage source 41 applies forward base-side potential 41a to base bias resistor 14. At the time of reverse conversion, variable voltage source 40 applies reverse collector-side potential 40b to collector-side resistor 10 and variable voltage source 41 applies reverse base-side potential 41b to base bias resistor 14. The base bias may be connected to the variable voltage source by the use of a different base bias configuration.

Although a variable emitter-side resistor has been used in the fourth embodiment, a variable inductor may be used instead of the variable emitter-side resistor and an inductor may be used instead of the collector-side resistor.

Fifth Embodiment

In a fifth embodiment, a bidirectional frequency converter in which a function of adjusting a conversion gain at the time of forward conversion and adjusting a phase of an output signal at the time of reverse conversion is added to the bidirectional frequency converter according to the second embodiment is explained. Only points different from the second embodiment are described below.

Figure 5A:
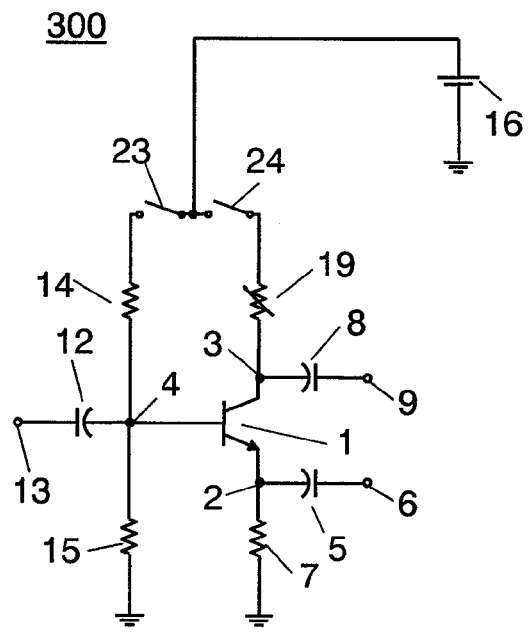
FIG. 5A is a circuit diagram illustrating a bidirectional frequency converter according to a fifth embodiment of the invention.

FIG. 5A is a circuit diagram illustrating bidirectional frequency converter 301 according to the fifth embodiment of the invention. The fifth embodiment is different from the second embodiment, in that variable collector-side resistor 19 instead of collector-side resistor 10 is connected to collector terminal 2 of bipolar transistor 1.

Accordingly, by varying the resistance value of variable collector-side resistor 19, it is possible to control the conversion gain of the IF signal to be output at the time of forward conversion. That is, when the resistance value of variable collector-side resistor 19 decreases, the conversion gain decreases and when the resistance of variable collector-side resistor 19 increases, the conversion gain increases.

At the time of reverse conversion, by varying the resistance value of variable collector-side resistor 19, it is possible to control the phase of the RF signal to be output by reverse conversion. That is, when the resistance value of variable collector-side resistor 19 decreases, the RF signal output by the reverse conversion advances in phase. When the resistance value of variable collector-side resistor 19 increases, the RF signal to be output by the reverse conversion lags in phase.

In the bidirectional frequency converter according to the fifth embodiment described above, it is possible to easily control the gain of the output signal.

Figure 5B:
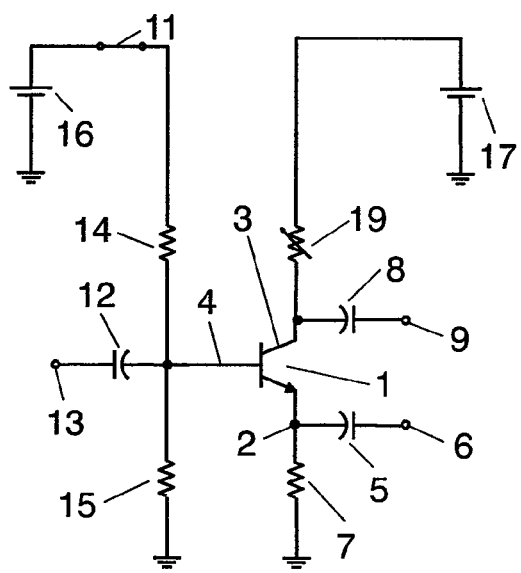
FIG. 5B is a circuit diagram illustrating the bidirectional frequency converter according to the fifth embodiment of the invention.

In the fifth embodiment, the collector-side resistor and the base bias resistor are connected to a common voltage source, but similarly to the bidirectional frequency converter according to the first embodiment, the collector-side resistor and the base bias resistor may be connected to different voltage sources, respectively. A circuit diagram of the bidirectional frequency converter at this time is shown in FIG. 5B.

Figure 5C:
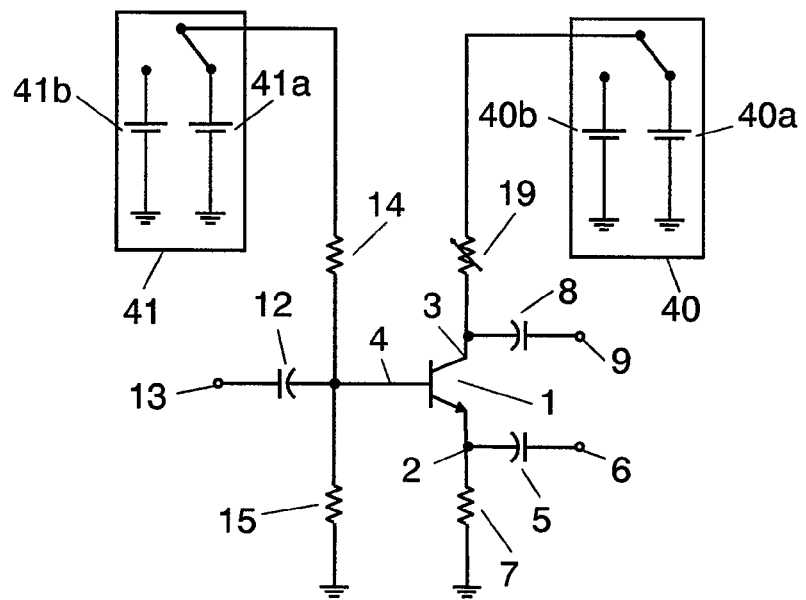
FIG. 5C is a circuit diagram illustrating the bidirectional frequency converter according to the fifth embodiment of the invention.

Alternatively, similarly to the bidirectional frequency converter according to the third embodiment, the collector-side resistor and the base bias resistor may be connected to different variable voltage sources. A circuit diagram of the bidirectional frequency converter at this time is shown in FIG. 5C. Specifically, at the time of forward conversion, variable voltage source 40 applies forward collector-side potential 40a to collector-side resistor 10 and variable voltage source 41 applies forward base-side potential 41a to base bias resistor 14. At the time of reverse conversion, variable voltage source 40 applies reverse collector-side potential 40b to collector-side resistor 10 and variable voltage source 41 applies reverse base-side potential 41b to base bias resistor 14. The base bias may be supplied from the variable voltage source by the use of a different base bias configuration.

An inductor may be used instead of the emitter-side resistor and a variable inductor may be used instead of the variable collector-side resistor.

Sixth Embodiment

In a sixth embodiment of the invention, a single-balance bidirectional frequency converter is provided.

Figure 6:
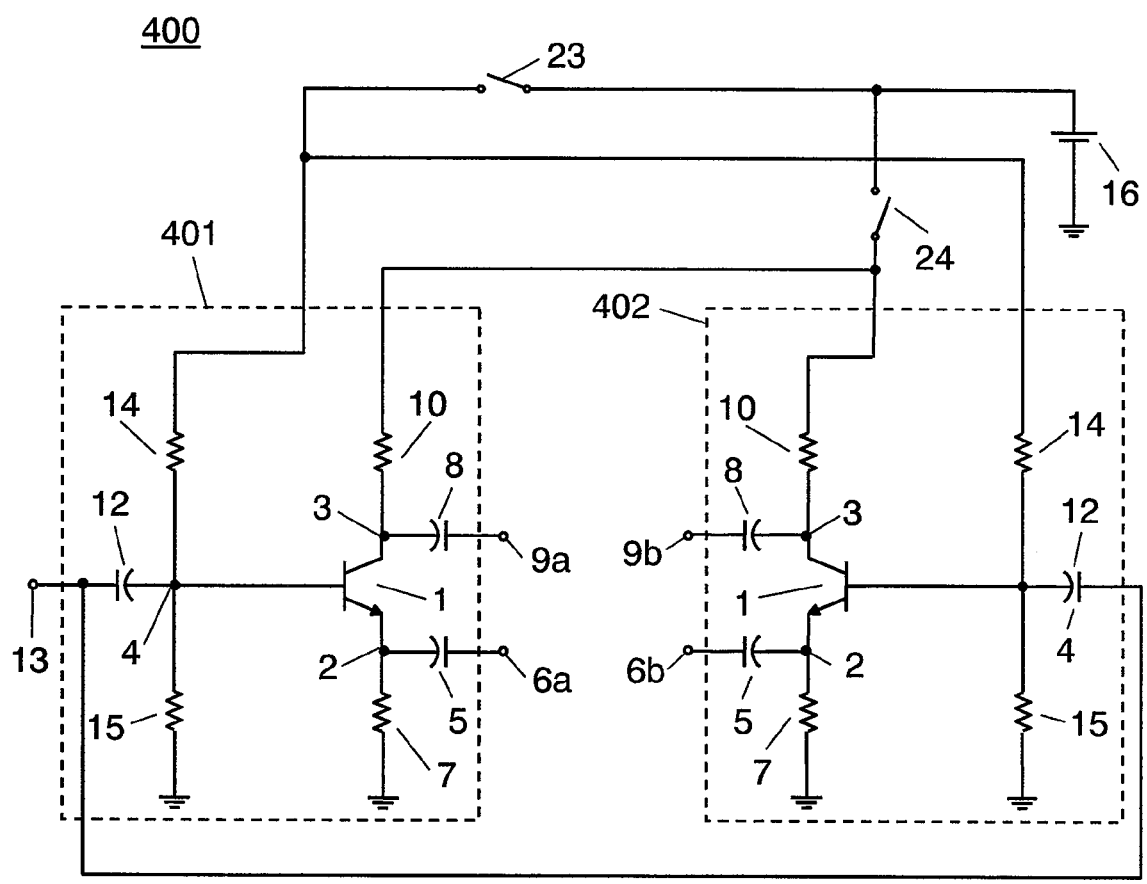
FIG. 6 is a circuit diagram illustrating a single-balance bidirectional frequency converter according to a sixth embodiment of the invention.

FIG. 6 is a circuit diagram illustrating single-balance bidirectional frequency converter 400 according to the sixth embodiment of the invention.

In FIG. 6, bidirectional frequency converters 401 and 402 are similar to that of the second embodiment and shares power supply switches 23 and 24 and voltage source 16. For this purpose, in bidirectional frequency converters 401 and 402, collector-side resistors 10 are connected to power supply switch 24 and base bias resistors 14 are connected to power supply switch 23. Both RF terminals are connected to each other and thus the RF signal is input thereto or output therefrom. A pair of IF terminals 9a and 9b and a pair of LO terminals 6a and 6b are provided.

An operation of the bidirectional frequency converter having the above-mentioned configuration is now described.

First, the forward conversion operation is described. At the time of forward conversion, power supply switches 23 and 24 are turned on. The RF signal is input to bidirectional frequency converters 401 and 402 from RF terminal 13. At this time, the LO signal is input to LO terminal 6a and an LOB signal having a phase difference of 180 degree with respect to the LO signal is input to LO terminal 6b. Accordingly, the signal (hereinafter, referred to as IF signal) output to IF terminal 9a and the signal (hereinafter, referred to as IFB signal) output to IF terminal 9b constitute a balance output having a phase difference of 180 degree. As a result, by differentially synthesizing the IF signal and the IFB signal, it is possible to obtain a relatively high conversion gain.

A reverse conversion operation is now described.

At the time of reverse conversion, power supply switches 23 and 24 are turned off. The IF signal is input to IF terminal 9a and the IFB signal having a phase difference of 180 degree with respect to the IF signal is input to IF terminal 9b. The LO signal is input to LO terminal 6a and the LOB signal having a phase difference of 180 degree with respect to the LO signal is input to LO terminal 6b. Accordingly, the signal output from bidirectional frequency converter 401 and the signal output from bidirectional frequency converter 402 have the same phase and the synthesized RF signal with a reduced conversion loss is output to RF terminal 13.

In the bidirectional frequency converter according to the sixth embodiment described above, since the signals output from a pair of IF signal terminals constitute a balance output having a phase difference of 180 degree at the time of forward frequency conversion in comparison with the second embodiment, it is possible to obtain a relatively high conversion gain by differential synthesis. Since the signals having a phase difference of 180 degree are input from a pair of IF signal terminals at the time of reverse frequency conversion, the signals output from the RF signal terminal have the same phase and thus it is possible to suppress the conversion loss.

Matching circuits may be added to RF terminal 13, LO terminal 6, and IF terminal 9, respectively. In this case, the matching circuit may be a matching circuit set to cope with the forward conversion or a matching circuit set to cope with the reverse conversion. The matching circuits may be varied or switched in accordance with the states at the time of forward conversion and at the time of reverse conversion.

In the sixth embodiment, by inputting and outputting the IF signal and the IFB signal to and from the pair of collector terminals and inputting and outputting the RF signals to and from the base terminals, the RF signal is converted into the IF signal by the forward conversion and the IF signal is converted into the RF signal by the reverse conversion, but the IF signal may be converted into the RF signal by the forward conversion and the RF signal may be converted into the IF signal by the reverse conversion by inputting and outputting an RF signal and a RFB signal having a phase difference of 180 degree with respect to the RF signal to and from the pair of collector terminals, and inputting and outputting the IF signals to and from the base terminals. By inputting and outputting a first intermediate frequency signal (IF1 signal) to and from the pair of collector terminals and inputting and outputting a second intermediate frequency signal (IF2 signal) to the base terminals, the IF2 signal may be converted into the IF1 signal by the forward conversion and the IF1 signal may be converted into the IF2 signal by the reverse conversion.

In the sixth embodiment, the LO signal having the same frequency is used for the forward conversion and the reverse conversion, but LO signals having different frequencies may be used for the forward conversion and the reverse conversion, respectively.

Figure 14:
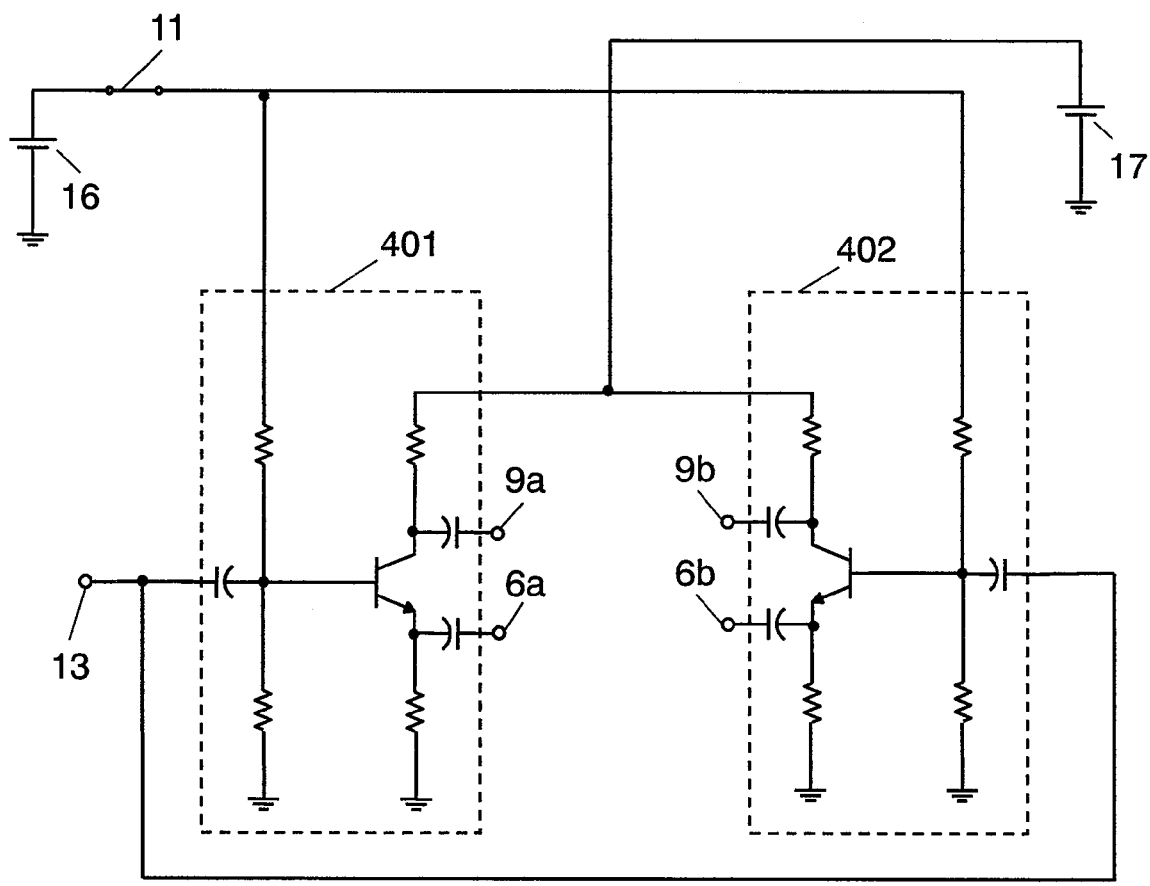
FIG. 14 is a circuit diagram illustrating a single-balance bidirectional frequency converter according to another example of the sixth embodiment of the invention.
Figure 18:
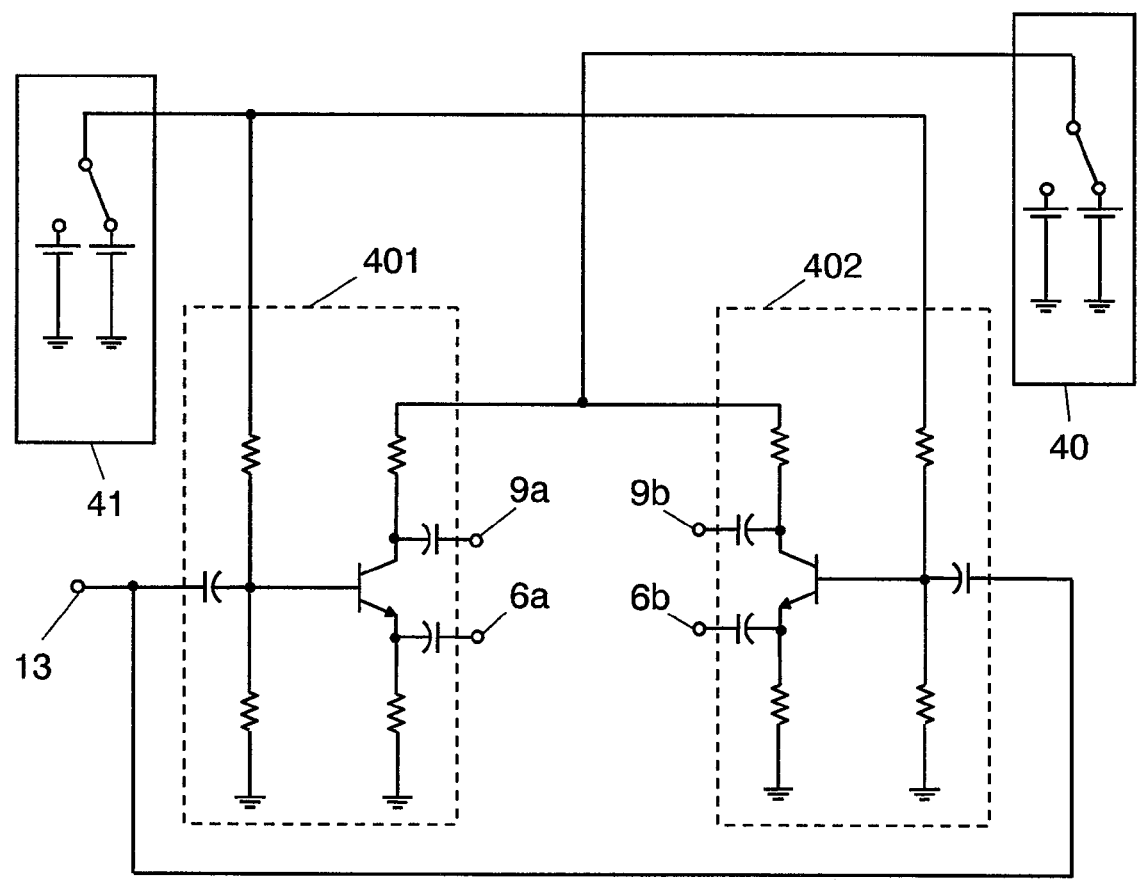
FIG. 18 is a circuit diagram illustrating a single-balance bidirectional frequency converter according to another example of the sixth embodiment of the invention.

In the sixth embodiment, the collector-side resistor and the base bias resistor are connected to a common voltage source, but similarly to the bidirectional frequency converter according to the first embodiment, the collector-side resistor and the base bias resistor may be connected to different voltage sources through different power supply switches. A circuit diagram of the bidirectional frequency converter at this time is shown in FIG. 14. Alternatively, similarly to the bidirectional frequency converter according to the third embodiment, the collector-side resistor and the base bias resistor may be connected to different variable voltage sources. A circuit diagram of the bidirectional frequency converter at this time is shown in FIG. 18. The base bias may be supplied from the variable voltage sources by the use of a different base bias configuration.

In the sixth embodiment, a single input and a balance output are provided by the forward conversion and a balance input and a single output are provided by the reverse conversion, but a balance input and a single output may be provided by the forward conversion and a single input and a balance output may be provided by the reverse conversion.

Seventh Embodiment

In a seventh embodiment of the invention, a single-balance bidirectional frequency converter in which a function of adjusting the conversion gain and a function of adjusting a phase of an output signal at the time of reverse conversion are added to the single-balance bidirectional frequency converter according to the sixth embodiment is provided. Only points different from the sixth embodiment are described below.

Figure 7:
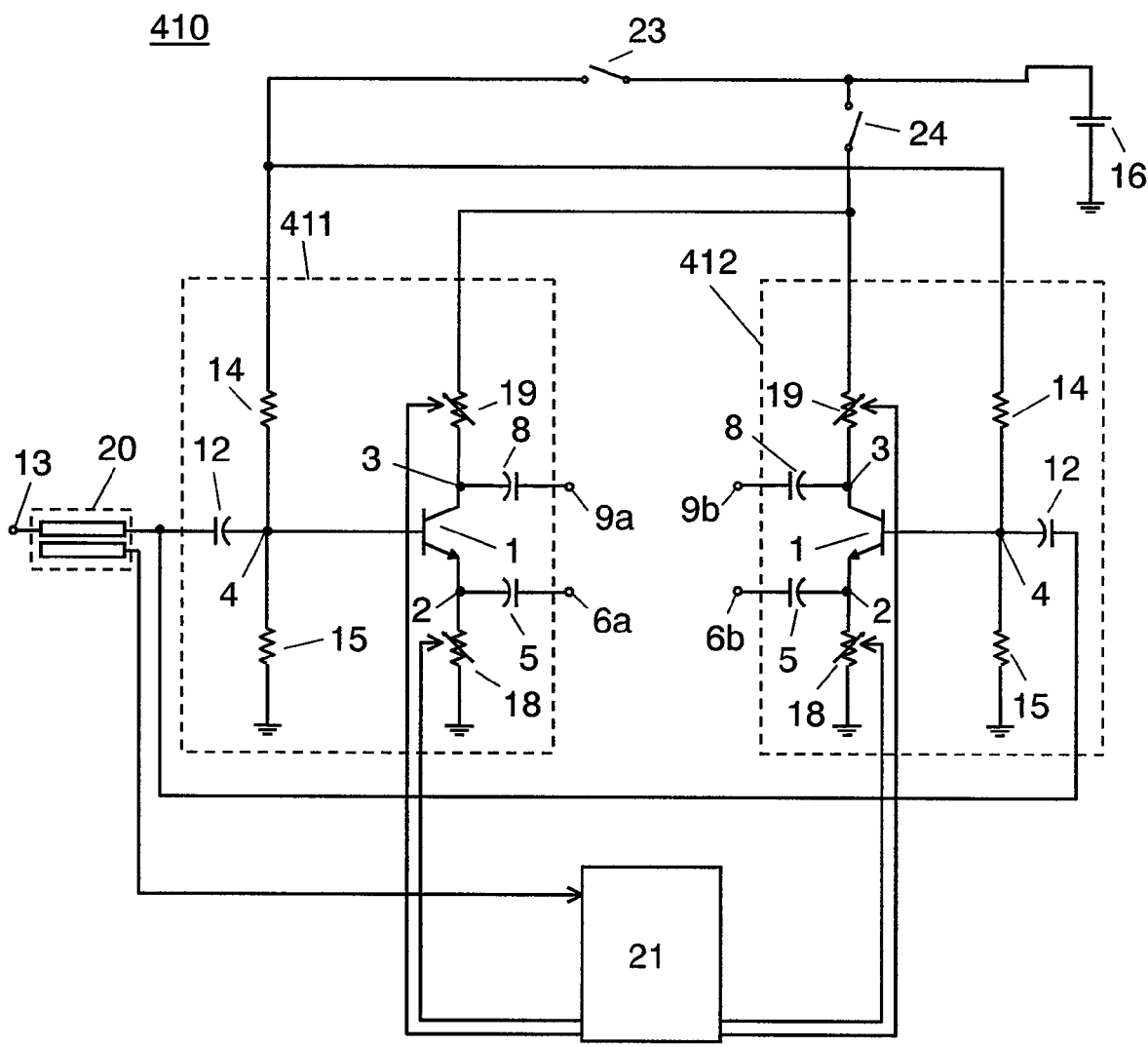
FIG. 7 is a circuit diagram illustrating a single-balance bidirectional frequency converter according to a seventh embodiment of the invention.

FIG. 7 is a circuit diagram illustrating single-balance bidirectional frequency converter 410 according to the seventh embodiment of the invention.

In FIG. 7, emitter terminals 2 of bidirectional frequency converters 411 and 412 are connected to LO terminals 6a and 6b for inputting the LO signal through capacitor 5 and are grounded through variable emitter-side resistors 18. Collector terminals 3 are connected to IF terminals 9a and 9b for inputting and outputting the IF signal through capacitor 8 and are connected to power supply switch 24 through variable collector-side resistors 19, respectively. Base terminals 4 are connected to power distributor 20 through capacitor 12 and are connected to base bias resistor 14 and base bias resistor 15, respectively. Base bias resistor 14 is connected to power supply switch 23 and base bias resistor 15 is grounded, thereby applying a base bias to base terminals 4.

In this way, bidirectional frequency converter 411 and bidirectional frequency converter 412 share power switches 23 and 24 and voltage source 16. Controller 21 is connected to power distributor 20, variable emitter-side resistor 18, and variable collector-side resistor 19, and varies the resistance values thereof by outputting a control signal corresponding to a distribution signal from power distributor 20 to variable emitter-side resistor 18 and variable collector-side resistor 19.

An operation of the bidirectional frequency converter having the above-mentioned configuration is now described. First, the forward conversion operation is described. At the time of forward conversion, power supply switches 23 and 24 are turned on. The RF signal is input to bidirectional frequency converters 411 and 412 from RF terminal 13. At this time, the LO signal is input to LO terminal 6a and an LOB signal having a phase difference of 180 degree with respect to the LO signal is input to LO terminal 6b. Accordingly, the signal output to IF terminal 9a and the signal output to IF terminal 9b constitute a balance output having a phase difference of 180 degree.

As a result, by differentially synthesizing the IF signal and the IFB signal, it is possible to obtain a relatively high conversion gain. At this time, a part of the power of the RF signal input to RF terminal 13 is distributed by power distributor 20 and then is input to the controller 21. The controller 21 outputs a control signal for decreasing the resistance value of variable emitter-side resistor 18 when the input from power distributor 20 is low, and outputs a control signal for increasing the resistance value of variable emitter-side resistor 18 when the input from power distributor 20 is high. Accordingly, it is possible to automatically control the conversion gain at the time of forward conversion.

The reverse conversion operation is now described. At the time of reverse conversion, power supply switch 11 is turned off. The IF signal is input to IF terminal 9a and the IFB signal is input to IF terminal 9b. The LO signal is input to LO terminal 6a and the LOB signal is input to LO terminal 6b.

Accordingly, the signal output from bidirectional frequency converter 411 and the signal output from bidirectional frequency converter 412 have the same phase and the synthesized RF signal with a reduced conversion loss is output to RF terminal 13. At this time, a part of the power of the RF signal output from bidirectional frequency converter 411 and bidirectional frequency converter 412 is distributed by power distributor 20 and then is input to the controller 21.

The controller 21 outputs a control signal for increasing the resistance value of variable emitter-side resistor 18 when the input from power distributor 20 is low, and outputs a control signal for decreasing the resistance value of variable emitter-side resistor 18 when the input from power distributor 20 is high. Accordingly, it is possible to automatically control the conversion gain at the time of reverse conversion. When the leakage of the LO signal and the IF signal is great, the controller 21 outputs a control signal for reducing the leakage of the LO signal and the IF signal to the variable emitter-side resistor 18 and variable collector-side resistor 19 for adjustment.

According to the bidirectional frequency converter according to the seventh embodiment in comparison with the sixth embodiment, since the power distributor detects the input signal level or the output signal level and changes the impedance value of the load impedance element, it is possible to automatically adjust the conversion gain and to keep the output at a predetermined level.

Eighth Embodiment

According to an eighth embodiment of the invention, a double-balance bidirectional frequency converter is provided.

Figure 8:
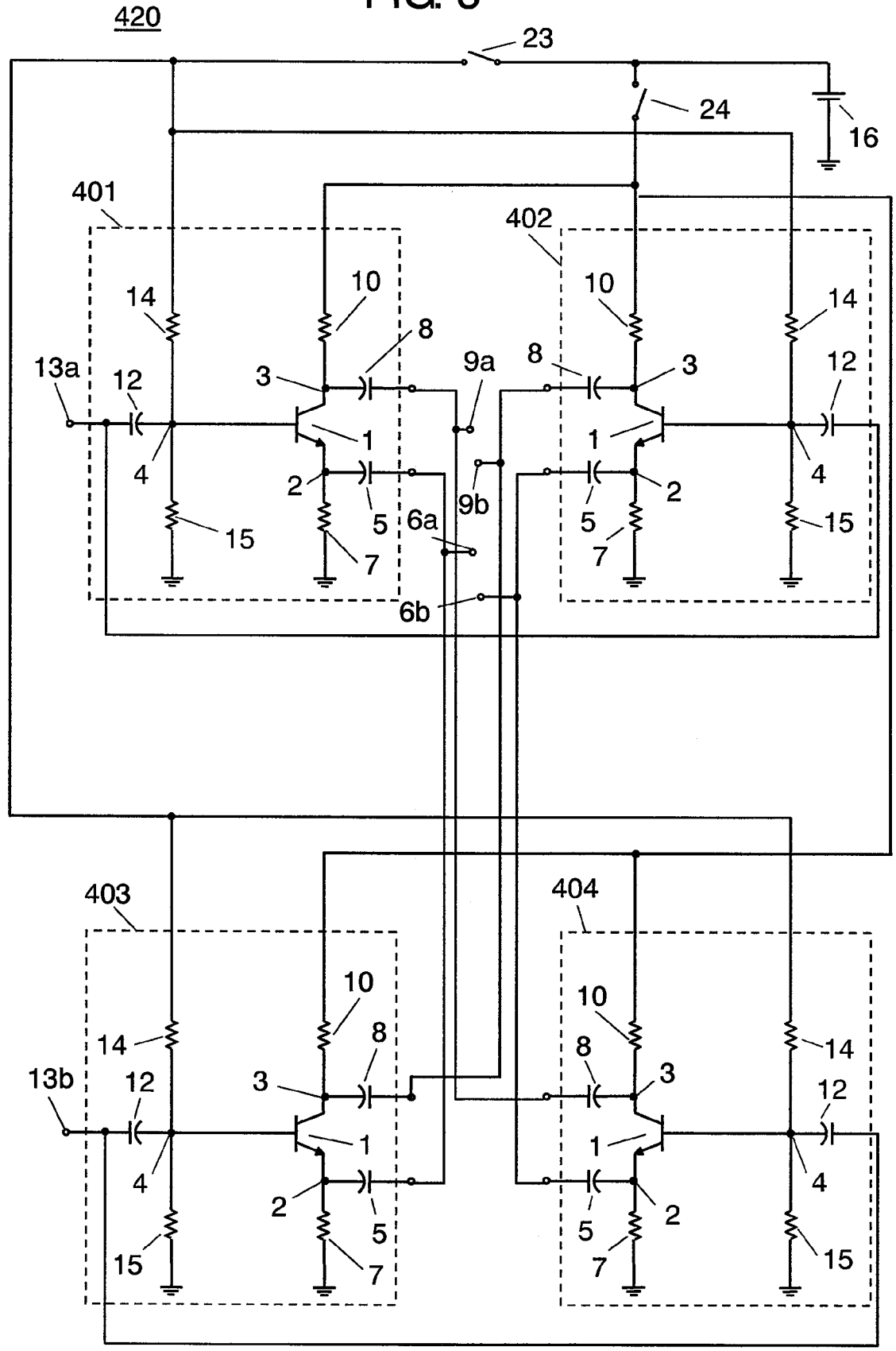
FIG. 8 is a circuit diagram illustrating a double-balance bidirectional frequency converter according to an eighth embodiment of the invention.

FIG. 8 is a circuit diagram illustrating double-balance bidirectional frequency converter 420 according to the eighth embodiment of the invention.

In FIG. 8, double-balance bidirectional frequency converter 420 includes bidirectional frequency converter 401, bidirectional frequency converter 402, bidirectional frequency converter 403, and bidirectional frequency converter 404. Bidirectional frequency converters 401, 402, 403, and 404 are similar to those of the second embodiment, and share power supply switches 23 and 24 and voltage source 16. For this purpose, in bidirectional frequency converters 401, 402, 403, and 404, collector-side resistors 10 are connected to power supply switch 24 and base bias resistors 14 are connected to power supply switch 23. Bidirectional frequency converter 401 and bidirectional frequency converter 402 share RF terminal 13a, and bidirectional frequency converter 403 and bidirectional frequency converter 404 share RF terminal 13b. Bidirectional frequency converter 401 and bidirectional frequency converter 403 share LO terminal 6a, and bidirectional frequency converter 402 and bidirectional frequency converter 404 share LO terminal 6b. Bidirectional frequency converter 401 and bidirectional frequency converter 404 share IF terminal 9a, and bidirectional frequency converter 402 and bidirectional frequency converter 403 share IF terminal 9b.

The forward conversion operation is now described. At the time of forward conversion, power supply switches 23 and 24 are turned on. The RF signal is input from RF terminal 13a and an RFB signal having a phase difference of 180 degree with respect to the RF signal is input from RF terminal 13b. The LO signal is input to LO terminal 6a and an LOB signal having a phase difference of 180 degree with respect to the LO signal is input to LO terminal 6b. Accordingly, the signal output to IF terminal 9a and the signal output to IF terminal 9b constitute a balance output having a phase difference of 180 degree. As a result, by differentially synthesizing the IF signal and the IFB signal, it is possible to obtain a relatively high conversion gain.

Since the LO signal and the LOB signal input to bidirectional frequency converter 401 and bidirectional frequency converter 404 synthesizing the output, respectively, have a phase difference of 180 degree, the signals are cancelled in IF terminal 9a, thereby suppressing the leakage of the LO signal and the LOB signal from IF terminal 9a. Similarly, it is possible to suppress the leakage of the LO signal and the LOB signal from IF terminal 9b.

The reverse conversion operation is now described. At the time of reverse conversion, power supply switches 23 and 24 are turned off. The IF signal is input to IF terminal 9a and the IFB signal is input to IF terminal 9b. The LO signal is input to LO terminal 6a and the LOB signal is input to LO terminal 6b. As a result, the RF signal is output to RF terminal 13a and the RFB signal having a phase difference of 180 degree with respect to the RF signal is output to RF terminal 13b. By differentially synthesizing the output signals, it is possible to further suppress the conversion loss. Similarly to the forward conversion, it is possible to suppress the leakage of the LO signal and the LOB signal from RF terminal 13a and RF terminal 13b.

In the bidirectional frequency converter according to the eighth embodiment described above, the double-balance configuration is provided. Accordingly, when differential signals are input to the pair of RF signal terminals at the time of the forward frequency conversion, the signals output from the pair of IF signal terminals constitute a balance output having a phase difference of 180 degree. As a result, it is possible to obtain the conversion gain higher than that of the sixth embodiment by differential synthesis. Since the signals having a phase difference of 180 degree are input from the pair of IF signal terminals at the time of the reverse frequency conversion, the signals output from the pair of RF signal terminals are differentially synthesized, thereby further suppressing the conversion loss.

Matching circuits may be added to RF terminal 13, LO terminal 6, and IF terminal 9, respectively. In this case, the matching circuit may be a matching circuit set to cope with the forward conversion or a matching circuit set to cope with the reverse conversion. The matching circuits may be varied or switched in accordance with the states at the time of forward conversion and at the time of reverse conversion.

In the eighth embodiment, the RF signal is converted into the IF signal by the forward conversion and the IF signal is converted into the RF signal by the reverse conversion by inputting and outputting the IF signal and the IFB signal to and from the pair of collector terminals and inputting and outputting the RF signal and the RFB signal to and from the pair of base terminals, but the IF signal may be converted into the RF signal by the forward conversion and the RF signal may be converted into the IF signal by the reverse conversion by inputting and outputting the RF signal and the RFB signal having a phase difference of 180 degree with respect to the RF signal to and from the pair of collector terminals, and inputting and outputting the IF signal and the IFB signal having a phase difference of 180 degree with respect to the IF signal to and from the pair of base terminals. In addition, by inputting and outputting a first intermediate frequency signal (IF1 signal) to and from the collector terminal and inputting and outputting a second intermediate frequency signal (IF2 signal) to and from the base terminal, the IF2 signal may be converted into the IF1 signal by the forward conversion and the IF1 signal may be converted into the IF2 signal by the reverse conversion.

In the eighth embodiment, the LO signal of the same frequency is used for the forward conversion and the reverse conversion, but LO signals of different frequencies may be used for the forward conversion and the reverse conversion, respectively.

Figure 15:
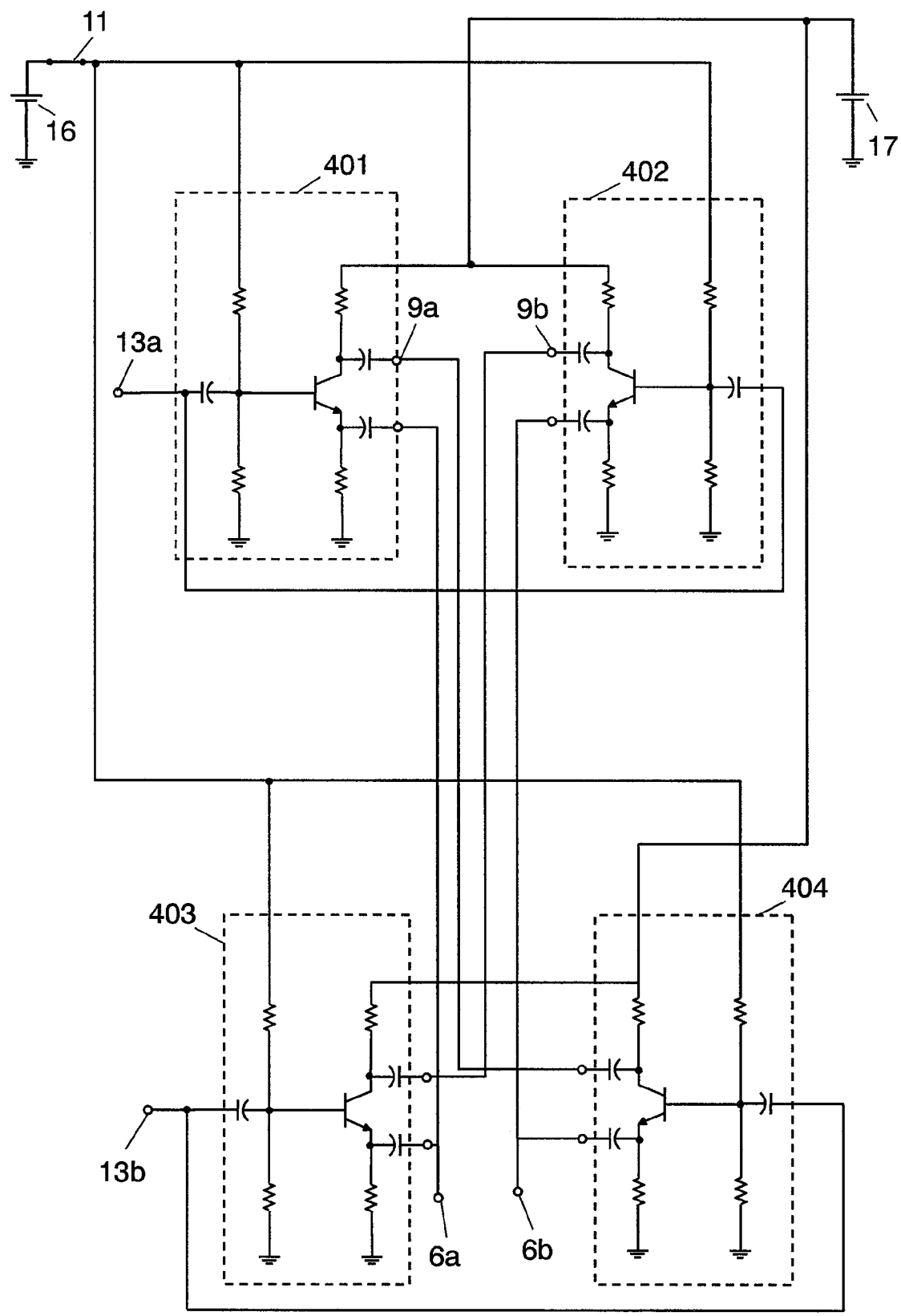
FIG. 15 is a circuit diagram illustrating a double-balance bidirectional frequency converter according to another example of the eighth embodiment of the invention.
Figure 19:
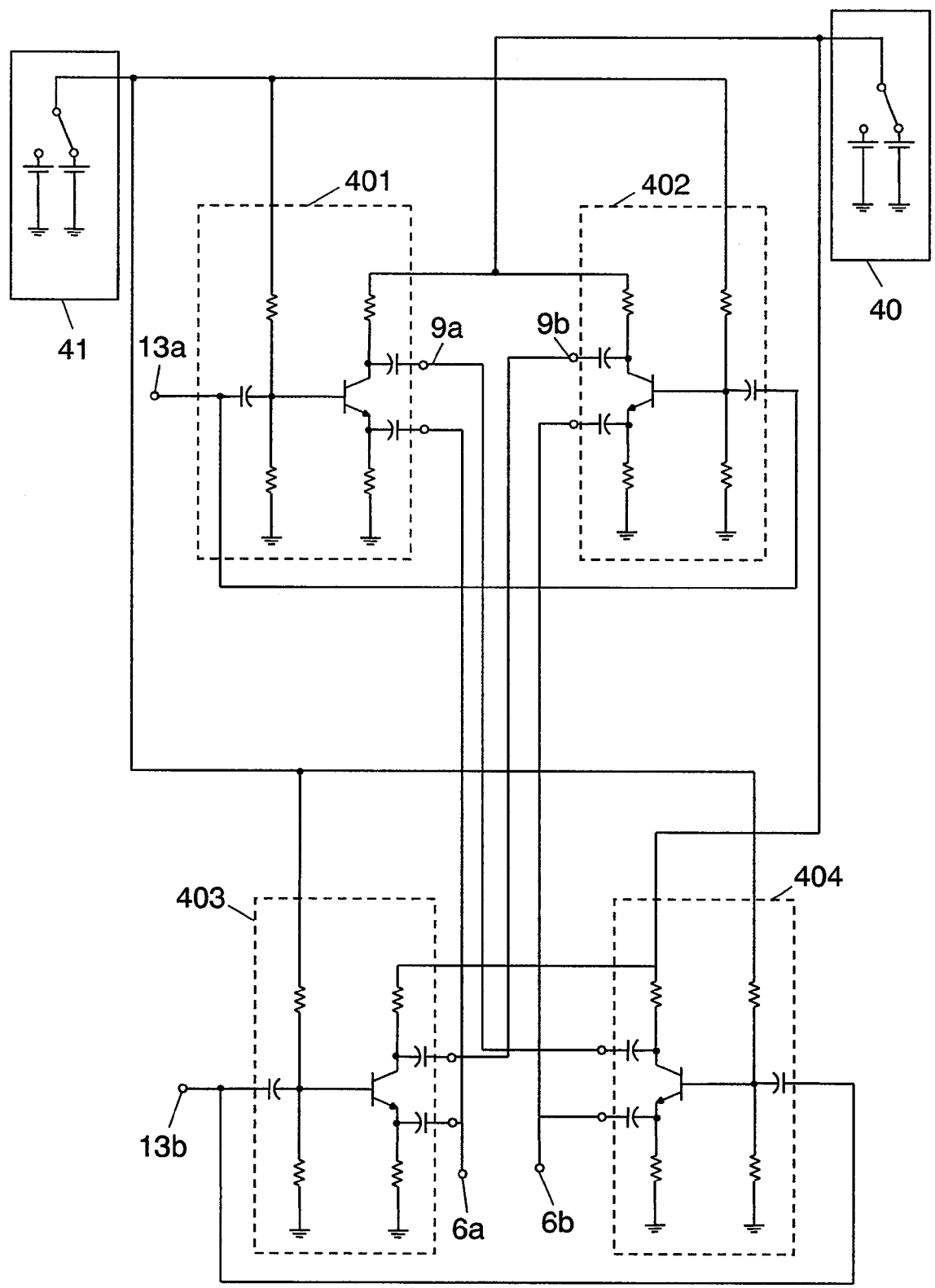
FIG. 19 is a circuit diagram illustrating a double-balance bidirectional frequency converter according to another example of the eighth embodiment of the invention.
Figure 20:
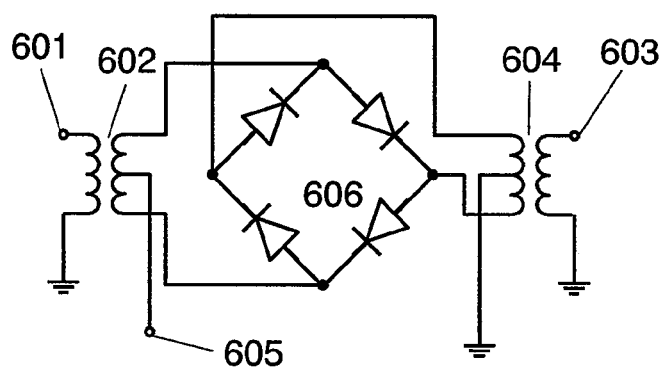
FIG. 20 is a circuit diagram illustrating a conventional bidirectional frequency converter.
Figure 21:
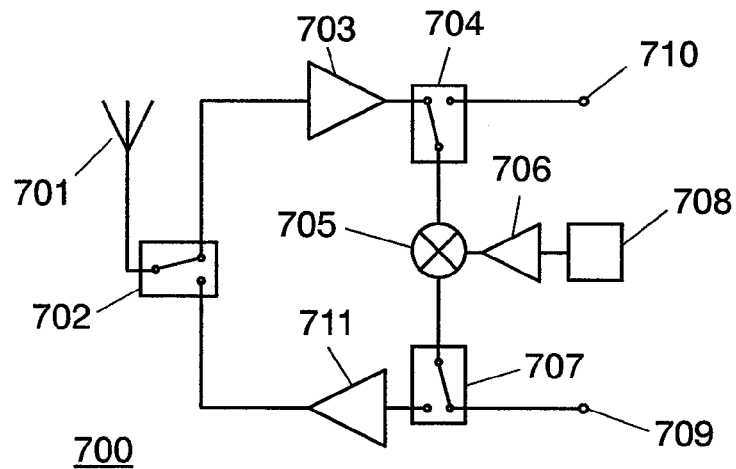
FIG. 21 is a diagram illustrating a configuration of a communication apparatus having a conventional bidirectional frequency converter.
Figure 22:
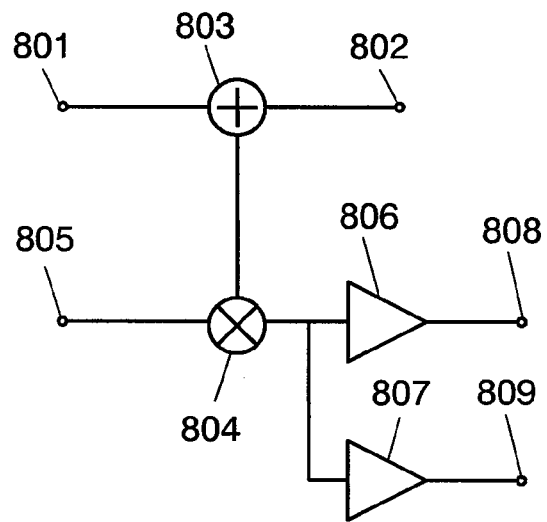
FIG. 22 is a diagram illustrating a configuration of a conventional bidirectional frequency converter.

In the eighth embodiment, the collector-side resistor and the base bias resistor are connected to a common voltage source, but similarly to the bidirectional frequency converter according to the first embodiment, the collector-side resistor and the base bias resistor may be connected to different voltage sources through different power supply switches, respectively. A circuit diagram of the bidirectional frequency converter at this time is shown in FIG. 15. Alternatively, similarly to the bidirectional frequency converter according to the third embodiment, the collector-side resistor and the base bias resistor may be connected to different variable voltage sources, respectively. A circuit diagram of the bidirectional frequency converter at this time is shown in FIG. 19. The base bias may be supplied from the variable voltage sources by the use of a different base bias configuration.

Although the double-balance bidirectional frequency converter has been described in the eighth embodiment, two double-balance bidirectional frequency converters may be used as an orthogonal modulator and demodulator.

Ninth Embodiment

A ninth embodiment of the invention provides double-balance bidirectional frequency conversion in which a function of adjusting a phase of an output signal at the time of the reverse conversion is added to the double-balance bidirectional frequency converter described in the eighth embodiment. Only points different from the eighth embodiment are described below.

Figure 9:
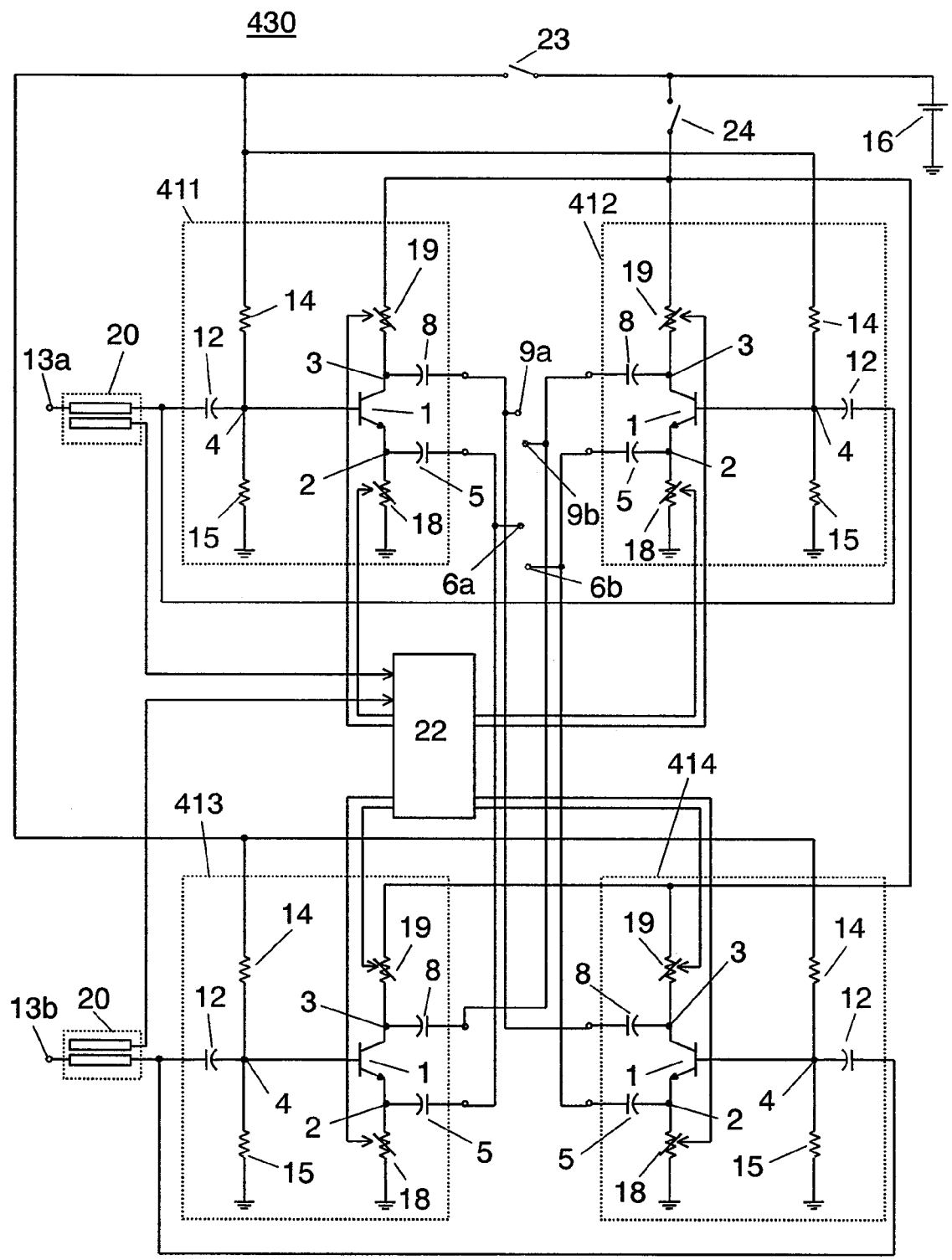
FIG. 9 is a circuit diagram illustrating a double-balance bidirectional frequency converter according to a ninth embodiment of the invention.

FIG. 9 is a circuit diagram illustrating double-balance bidirectional frequency converter 430 according to the ninth embodiment of the invention. The ninth embodiment is different from the eighth embodiment, in that the bidirectional frequency converter has power distributor 20 and controller 22.

Power distributor 20 is connected to RF terminals 13 and 13a and serves to distribute a part of power of an input or output RF signal to RF terminals 13 and 13a.

Controller 22 is connected to power distributor 20, variable emitter-side resistor 18, and variable collector-side resistor 19, and varies the resistance values thereof by outputting a control signal corresponding to a distribution signal from power distributor 20 to variable emitter-side resistor 18 and variable collector-side resistor 19.

An operation of the bidirectional frequency converter having the above-mentioned configuration is now described.

First, the forward conversion operation is described. At the time of forward conversion, power supply switches 23 and 24 are turned on. The RF signal is input from RF terminal 13 and the RFB signal having a phase different of 180 degree with respect to the RF signal is input from RF terminal 13b. The LO signal is input to LO terminal 6a and an LOB signal having a phase difference of 180 degree with respect to the LO signal is input to LO terminal 6b.

Accordingly, the signal output to IF terminal 9a and the signal output to IF terminal 9b constitute a balance output having a phase difference of 180 degree. As a result, it is possible to obtain a relatively high conversion gain by differentially synthesizing the IF signal and the IFB signal.

Since the LO signal and the LOB signal input to bidirectional frequency converter 411 and bidirectional frequency converter 413 synthesizing the output, respectively, have a phase difference of 180 degree, the signals are cancelled in IF terminal 9a, thereby suppressing the leakage of the LO signal and the LOB signal from IF terminal 9a. Similarly, it is possible to suppress the leakage of the LO signal and the LOB signal from IF terminal 9b.

At this time, a part of the power of the RF signal and the RFB signal input to RF terminal 13a and RF terminal 13b is distributed by power distributor 20 and is input to controller 22. Controller 22 outputs a control signal for decreasing the resistance value of variable emitter-side resistor 18 when the input from power distributor 20 is low, and outputs a control signal for increasing the resistance value of variable emitter-side resistor 18 when the input from power distributor 20 is high. Accordingly, it is possible to automatically control the conversion gain at the time of forward conversion.

The reverse conversion operation is now described. At the time of reverse conversion, power supply switch 11 is turned off. The IF signal is input to IF terminal 9a and the IFB signal is input to IF terminal 9b. The LO signal is input to LO terminal 6a and the LOB signal is input to LO terminal 6b. As a result, the RF signal is output to RF terminal 13a and the RFB signal having a phase difference of 180 degree with respect to the RF signal is output to RF terminal 13b. By differentially synthesizing the output signals, it is possible to further suppress the conversion loss.

Similarly to the forward conversion, it is possible to suppress the leakage of the LO signal and the LOB signal from RF terminal 13a and RF terminal 13b. At this time, a part of the power of the RF signal output from bidirectional frequency converter 411 and bidirectional frequency converter 412 and the RFB signal output from bidirectional frequency converter 413 and bidirectional frequency converter 414 is distributed by power distributor 20 and is input to controller 22.

Controller 22 outputs a control signal for increasing the resistance value of variable emitter-side resistor 18 when the input from power distributor 20 is low, and outputs a control signal for decreasing the resistance value of variable emitter-side resistor 18 when the input from power distributor 20 is high. Accordingly, it is possible to automatically control the conversion loss at the time of reverse conversion. When the leakage of the LO signal and the IF signal is great, controller 22 outputs a control signal for decreasing the leakage of the LO signal and the IF signal to variable emitter-side resistor 18 and variable collector-side resistor 19 for adjustment.

In the bidirectional frequency converter according to the ninth embodiment described above, in comparison with the eighth embodiment, since the power distributor detects the input signal level or the output signal level and changes the impedance value of the load impedance element, it is possible to maintain the output at a predetermined level by automatically adjusting the conversion gain.

In the ninth embodiment, the collector-side resistor and the base bias resistor are connected to a common voltage source, but similarly to the bidirectional frequency converter according to the first embodiment, the collector-side resistor and the base bias resistor may be connected to different voltage sources through different power supply switches, respectively. Alternatively, similarly to the bidirectional frequency converter according to the third embodiment, the collector-side resistor and the base bias resistor may be connected to different variable voltage sources, respectively. The base bias may be supplied from the variable voltage sources by the use of a different base bias configuration.

Although the double-balance bidirectional frequency converter has been described in the ninth embodiment, two double-balance bidirectional frequency converters may be used as an orthogonal modulator and demodulator.

Tenth Embodiment

According to a tenth embodiment, there is provided a radio apparatus employing the bidirectional frequency converters described in the first to ninth embodiments.

Figure 10:
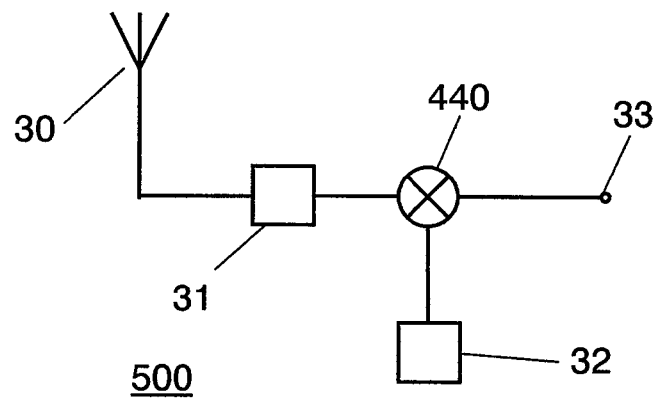
FIG. 10 is a block diagram illustrating a radio apparatus according to a tenth embodiment of the invention.

FIG. 10 is a block diagram illustrating radio apparatus 500 according to the tenth embodiment of the invention. In FIG. 10, antenna 30 is connected to bidirectional amplifier 31, bidirectional amplifier 31 is connected to bidirectional frequency converter 440 which is any one of the bidirectional frequency converters according to the first to ninth embodiments, and bidirectional frequency converter 440 is connected to LO signal oscillator 32 and IF terminal 33. Antenna 30, bidirectional amplifier 31, and bidirectional frequency converter 440 are shared with a transmitter.

An operation of the radio apparatus having the above-mentioned configuration is described below.

At the time of reception, the radio apparatus according to the tenth embodiment amplifies a reception RF signal received through antenna 30 by the use of bidirectional amplifier 31 and then outputs the amplified reception RF signal to bidirectional frequency converter 440. Bidirectional frequency converter 440 mixes the reception RF signal with the LO signal output from LO signal oscillator 32 and outputs a reception IF signal to IF terminal 33. At the time of transmission, bidirectional frequency converter 440 mixes a transmission IF signal input from IF terminal 33 with the LO signal and outputs a transmission RF signal to bidirectional amplifier 31. Then, bidirectional amplifier 31 amplifies the transmission RF signal and outputs the amplified transmission RF signal to antenna 30 for radiation to the air.

In the radio apparatus according to the tenth embodiment described above, since the conversion from the IF signal to the RF signal and the conversion from the RF signal to the IF signal can be carried out by one frequency converter without using any external circuit such as a switch for switching a signal path, it is possible to accomplish simplification, decrease in size, and reduction in cost of the radio apparatus. In addition, since the frequency conversion of a reception system is allowed to provide a conversion gain, it is possible to reduce a burden on other gain stages. Accordingly, the restriction to an installation position of an amplifier is alleviated and the flexibility in design of the whole system of the radio unit is enhanced, thereby making the design of structure easy.

In the tenth embodiment, the frequency conversion of the bidirectional frequency converter is carried out from the RF signal to the IF signal and from the IF signal to the RF signal, but the RF signal may be converted into a base band signal and the base band signal may be converted into the RF signal.

Eleventh Embodiment

An eleventh embodiment provides a configuration that the bidirectional amplifier of the radio apparatus according to the tenth embodiment is composed of two amplifiers and a 3-terminal switch.

Figure 11:
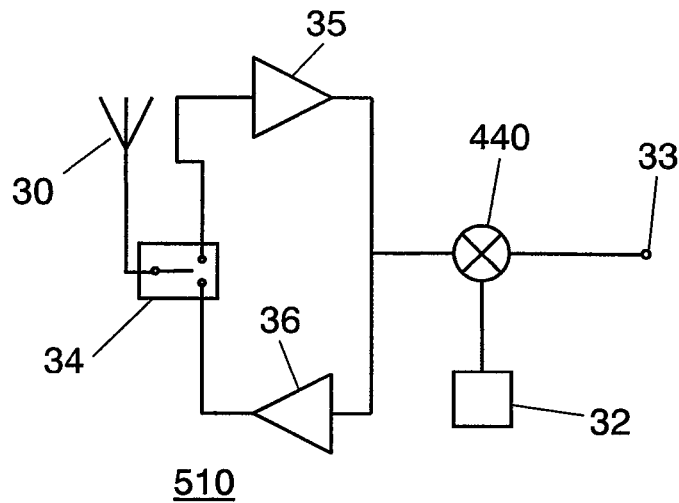
FIG. 11 is a block diagram illustrating a radio apparatus according to an eleventh embodiment of the invention.

FIG. 11 is a block diagram illustrating radio apparatus 510 according to the eleventh embodiment of the invention. In FIG. 11, antenna 30 is connected to a common terminal of switch 34. One of connection terminals of switch 34 is connected to an input terminal of amplifier 35 and the other is connected to an output terminal of amplifier 36. An output terminal of amplifier 35 and an input terminal of amplifier 36 are connected to bidirectional frequency converter 440. Other configuration is similar to that of the tenth embodiment. Amplifiers 35 and 36 correspond to the first amplifier, respectively, and the second amplifier according to the invention.

An operation of the radio apparatus having the above-mentioned configuration is described below.

In the radio apparatus according to the eleventh embodiment, at the time of reception, antenna 30 and amplifier 35 are electrically connected to each other by switch 34 and the reception RF signal received by antenna 30 is amplified by amplifier 35. Then, the amplified reception RF signal is output to bidirectional frequency converter 440. In bidirectional frequency converter 440, the LO signal output from LO signal oscillator 32 is mixed with the reception RF signal and then a reception IF signal is output to IF terminal 33. In the radio apparatus according to the eleventh embodiment, at the time of transmission, antenna 30 and amplifier 36 are electrically connected to each other by switch 34. The RF signal output from bidirectional frequency converter 440 is amplified by amplifier 36 and is output to antenna 30 for radiation to the air.

Since the radio apparatus according to the eleventh embodiment described above can be constructed by general electronic components and one frequency converter according to the invention, it is possible to further facilitate the design of a radio apparatus.

In the eleventh embodiment, the bidirectional frequency converter is used as a first-stage frequency converter, but the bidirectional frequency converter may be used as a second-stage frequency converter to convert a first IF signal into a second IF signal and to convert the second IF signal into the first IF signal.

In the eleventh embodiment, the path of the transmitter is switched by the use of switch 34, but a duplexer may be used instead.

Twelfth Embodiment

A twelfth embodiment provides a configuration of further amplifying the RF signal of the radio apparatus according to the eleventh embodiment and outputting the amplified RF signal.

Figure 12:
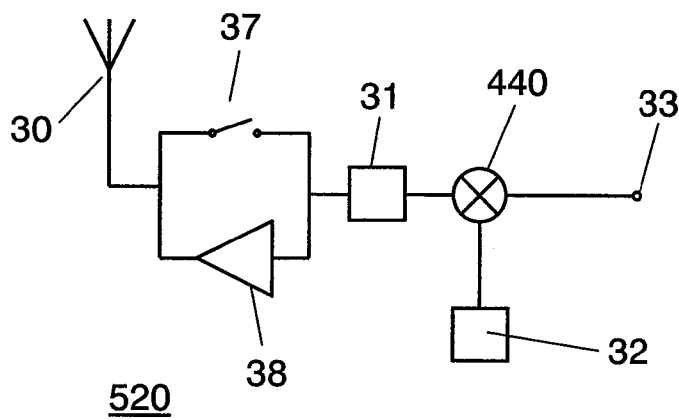
FIG. 12 is a block diagram illustrating a radio apparatus according to a twelfth embodiment of the invention.

FIG. 12 is a block diagram illustrating radio apparatus 520 according to the twelfth embodiment of the invention. In FIG. 12, antenna 30, one connection terminal of 2-terminal switch 37, and an output terminal of power amplifier 38 are connected to each other, and the other connection terminal of 2-terminal switch 37, an input terminal of power amplifier 38, and bidirectional amplifier 31 are connected to each other. Other configurations are similar to those of the tenth embodiment.

An operation of the radio apparatus having the above-mentioned configuration is described below.

At the time of reception, the radio apparatus according to the twelfth embodiment turns on 2-terminal switch 37 to electrically connect antenna 30 to bidirectional amplifier 31, amplifies the reception RF signal received by antenna 30 by the use of bidirectional amplifier 31, and outputs the amplified reception RF signal to bidirectional frequency converter 440. At the time of transmission, 2-terminal switch 37 is turned off to electrically connect antenna 30 to power amplifier 38. Then, power amplifier 38 further amplifies the transmission RF signal amplified by bidirectional amplifier 31 and outputs the amplified transmission RF signal to antenna 30 for radiation to the air.

In the radio apparatus according to the twelfth embodiment described above, it is possible to embody a radio apparatus having high power only at the time of transmission.

In the twelfth embodiment, the bidirectional frequency converter is used as a first-stage frequency converter, but the bidirectional frequency converter may be used as a second-stage frequency converter to convert a first IF signal into a second IF signal and to convert the second IF signal into the first IF signal.

In the twelfth embodiment, the path of the transmitter is switched by the use of the switch, but a duplexer may be used instead.

INDUSTRIAL APPLICABILITY

The bidirectional frequency converter according to the present invention is suitable for converting a frequency of a signal in a radio circuit of a wireless communication apparatus.

The invention claimed is:

1. A bidirectional frequency converter comprising:
a bipolar transistor;
a load impedance element connected to a collector terminal of the bipolar transistor;
a bias part for supplying a bias to a base terminal of the bipolar transistor;
a first switch for permitting and blocking power supply to the bias part; and
an emitter impedance element connected to an emitter terminal of the bipolar transistor,
wherein an output signal of a second frequency, which is a mixture signal including an input signal of a first frequency input from a first signal terminal connected to the base terminal and a local oscillation signal input from a third signal terminal connected to the emitter terminal, is output from a second signal terminal connected to the collector terminal when the first switch is turned on and a bias is supplied, and
wherein an output signal of the first frequency, which is a mixture signal including an input signal of the second frequency input from the second signal terminal and the local oscillation signal input from the third signal terminal, is output from the first signal terminal when the first switch is turned off.

2. The bidirectional frequency converter of claim 1, further comprising a second switch for permitting and blocking power supply to the load impedance element,
wherein the second switch is turned on and off in synchronization with the first switch.

3. The bidirectional frequency converter of claim 1, wherein when the first frequency is a radio frequency, the second frequency is an intermediate frequency, and when the first frequency is an intermediate frequency, the second frequency is a radio frequency.

4. A bidirectional frequency converter comprising a pair of the bidirectional frequency converters of claim 3,
wherein a new first signal terminal is constructed by connecting the first signal terminals of the pair of bidirectional frequency converters to each other, and a single balance configuration is constructed by inputting differential local oscillation signals to third signal terminals of the pair of bidirectional frequency converters.

5. The bidirectional frequency converter of claim 4, wherein the emitter impedance element of the pair of bidirectional frequency converters is a variable emitter impedance element and the load impedance element is a variable load impedance element,
wherein the bidirectional frequency converter further comprises
a power distributor for distributing power of a signal inputting to and outputting from the new first signal terminal and
a controller for outputting a control signal corresponding to the signal distributed by the power distributor, and
wherein a phase of an output signal is controlled by varying the impedance values of the variable emitter impedance element and the variable load impedance element by the use of the control signal.

6. A bidirectional frequency converter comprising four bidirectional frequency converters of claim 3,
wherein a first pair of signal terminals is constructed newly by connecting the first signal terminals of the first bidirectional frequency converter and the second bidirectional frequency converter among the four bidirectional frequency converters to each other and connecting the first signal terminals of the third bidirectional frequency converter and the fourth bidirectional frequency converter to each other,
wherein a second pair of signal terminals is constructed newly by connecting the second signal terminals of the first bidirectional frequency converter and the fourth bidirectional frequency converter to each other and connecting the second signal terminals of the second bidirectional frequency converter and the third bidirectional frequency converter to each other,
wherein a third pair of signal terminals is constructed newly by connecting the third signal terminals of the first bidirectional frequency converter and the third bidirectional frequency converter to each other and connecting the third signal terminals of the second bidirectional frequency converter and the fourth bidirectional frequency converter to each other, and
wherein a double balance configuration is constructed by inputting differential local oscillation signals to the third pair of signal terminals.

7. The bidirectional frequency converter of claim 6, wherein the emitter impedance element of the four bidirectional frequency converters is a variable emitter impedance element and the load impedance element is a variable load impedance element,
wherein the bidirectional frequency converter further comprises
a power distributor for distributing power of a signal inputting to and outputting from the new first signal terminal and
a controller for outputting a control signal corresponding to the signal distributed by the power distributor, and
wherein a phase of an output signal is controlled by varying the impedance values of the variable emitter impedance element and the variable load impedance element by the use of the control signal.

8. The bidirectional frequency converter of claim 3, wherein the load impedance element is one of a load resistor and a load inductor.

9. The bidirectional frequency converter of claim 3, wherein the load impedance element is a variable load impedance element, and
wherein by varying the impedance value of the variable load impedance element, a phase of an output signal from the first signal terminal is controlled and a gain of an output signal from the second signal terminal is controlled.

10. The bidirectional frequency converter of claim 3, wherein the emitter impedance element is one of an emitter resistor and an emitter inductor.

11. The bidirectional frequency converter of claim 3, wherein the emitter impedance element is a variable emitter impedance element, and
wherein by varying the impedance value of the variable emitter impedance element, a phase of an output signal obtained from the first signal terminal is controlled and a gain of an output signal obtained from the second signal terminal is controlled.

12. The bidirectional frequency converter of claim 3, wherein an FET is used instead of the bipolar transistor, the base terminal is replaced with a gate terminal of the FET, the emitter terminal is replaced with a source terminal of the FET, and the collector terminal is replaced with a drain terminal of the FET.

13. A radio apparatus comprising:
an antenna;
a bidirectional amplifier connected to the antenna;
a bidirectional frequency converter of claim 1 connected to the antenna through the bidirectional amplifier; and
a local oscillator connected to the bidirectional frequency converter so as to input a local oscillation signal thereto.

14. The radio apparatus of claim 13, wherein the bidirectional amplifier comprises:
a 3-terminal switch;
a first amplifier of which an input terminal is connected to one connection terminal of the 3-terminal switch; and
a second amplifier of which an output terminal is connected to the other connection terminal of the 3-terminal switch, and
wherein the antenna is connected to a common terminal of the 3-terminal switch and an output terminal of the first amplifier and an input terminal of the second amplifier are connected to the bidirectional frequency converter.

15. The radio apparatus of claim 13, further comprising a power amplifier and a 2-terminal switch disposed between the antenna and the bidirectional amplifier,
wherein an output terminal of the power amplifier and one terminal of the 2-terminal switch are connected to the antenna, and
wherein an input terminal of the power amplifier and the other terminal of the 2-terminal switch are connected to the bidirectional amplifier.

* * * * *